(12) United States Patent
Osada et al.

(10) Patent No.: US 6,839,268 B2
(45) Date of Patent: *Jan. 4, 2005

(54) SEMICONDUCTOR MEMORY APPARATUS, SEMICONDUCTOR APPARATUS, DATA PROCESSING APPARATUS AND COMPUTER SYSTEM

(75) Inventors: Kenichi Osada, Kokubunji (JP); Hisayuki Higuchi, Kokubunji (JP); Koichiro Ishibashi, Warabi (JP)

(73) Assignee: Renesas Technology Corp., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/686,569

(22) Filed: Oct. 17, 2003

(65) Prior Publication Data

US 2004/0083329 A1 Apr. 29, 2004

Related U.S. Application Data

(63) Continuation of application No. 10/320,516, filed on Dec. 17, 2002, now Pat. No. 6,665,209, which is a continuation of application No. 09/988,197, filed on Nov. 19, 2001, now Pat. No. 6,515,894, which is a continuation of application No. 09/577,149, filed on May 24, 2000, now Pat. No. 6,396,732, which is a continuation of application No. 08/906,883, filed on Aug. 6, 1997, now Pat. No. 6,091,629.

(30) Foreign Application Priority Data

Aug. 6, 1996 (JP) .............................. 8-206869
Jan. 30, 1997 (JP) .............................. 9-016223

(51) Int. Cl.$^7$ .............................................. G11C 11/00
(52) U.S. Cl. .................. 365/156; 365/154; 365/230.03
(58) Field of Search ................................ 365/156, 154, 365/230.03

(56) References Cited

U.S. PATENT DOCUMENTS 4,984,204 A   1/1991   Sato et al.
5,053,652 A   10/1991  Sato et al.

(List continued on next page.)

FOREIGN PATENT DOCUMENTS

| JP | 2-50396 | 2/1990 |
|---|---|---|
| JP | 3-3195 | 1/1991 |
| JP | 3-216892 | 9/1991 |
| JP | 4-85789 | 3/1992 |
| JP | 7-201197 | 8/1995 |
| JP | 7-320480 | 12/1995 |
| JP | 8-212776 | 8/1996 |

OTHER PUBLICATIONS

Osada et al., "A 2ns Access, 285MHz, Two–Port Cache Macro Using Double Global Bit–Line Pairs" ISSCC Digest of Technical Papers, pp. 402–403.
Kushiyami et al., "A 295MHz CMOS 1M (x256) Embedded SRAM Using Bi–directional Read/Write Shared Sense Amps and Self–Timed Pulsed Word–Line Drivers" ISSCC Digest of Technical Papers, Feb. 1995, pp. 304–305.
IEEE Journal of Solid State Circuits, vol. 23, No. 5, Oct. 1988, pp. 1048–1053.

*Primary Examiner*—Hoai Ho
(74) *Attorney, Agent, or Firm*—Antonelli, Terry, Stout & Kraus, LLP

(57) ABSTRACT

A semiconductor memory apparatus is provided with a memory array, a first global bit line connected to a sense amplifier, a second global bit line connected to a write amplifier, and a selection circuit for connecting a plurality of bit lines selectively to the first global bit line and the second global bit line.

8 Claims, 18 Drawing Sheets

U.S. PATENT DOCUMENTS

| | | |
|---|---|---|
| 5,253,207 A | 10/1993 | Shikatani |
| 5,387,827 A | 2/1995 | Yokoyama et al. |
| 5,517,462 A | 5/1996 | Iwamoto et al. |
| 5,535,172 A | 7/1996 | Reddy et al. |
| 5,537,346 A | 7/1996 | Seo et al. |
| 5,570,319 A | 10/1996 | Santoro et al. |
| 5,574,687 A | 11/1996 | Nakase |
| 5,657,273 A | 8/1997 | Ayukawa et al. |
| 5,657,286 A | 8/1997 | Arimoto |
| 5,675,529 A | 10/1997 | Poole |
| 6,515,894 B2 * | 2/2003 | Osada et al. ................. 365/156 |

* cited by examiner

SEMICONDUCTOR MEMORY APPARATUS, SEMICONDUCTOR APPARATUS, DATA PROCESSING APPARATUS AND COMPUTER SYSTEM

CROSS-REFERENCE TO RELATED APPLICATIONS

This is a continuation application of Ser. No. 10/320,516, filed Dec. 17, 2002 (now U.S. Pat. No. 6,665,209), which is a continuation of application Ser. No. 09/988,197, filed Nov. 19, 2001 (now U.S. Pat. No. 6,515,894); which is a continuation of application Ser. No. 09/577,149, filed May 24, 2000 (now U.S. Pat. No. 6,396,732); which is a continuation of application Ser. No. 08/906,883, filed Aug. 6, 1997 (now U.S. Pat. No. 6,091,629), the entire disclosures of which are hereby incorporated by reference.

BACKGROUND OF THE INVENTION

The present invention relates to a semiconductor memory apparatus, or more in particular to a technique effectively applicable to a cache memory built in a data processing apparatus like a microprocessor or a microcomputer.

In recent years, with the increase in the operating frequency of the microprocessor, there has been an increasing demand for a cache memory of a higher speed. In the cache memory, data are written by transmitting signals to memory cells through bit lines, and are read from the memory cells by transmitting them to an amplifier circuit through bit lines. For a cache memory of a high operating speed to be realized, therefore, it is crucial to reduce the capacity of the bit lines. Memories with a reduced capacity of bit lines include a circuit with a memory mat divided and bit lines formed in a hierarchy (hereinafter referred to as the prior art 1) disclosed in ISSCC Digest of Technical Papers, pp. 304–305, February, 1995.

The memory according to the prior art 1 comprises a memory mat with 6-transistor memory cells arranged in an array and divided into n equal parts to form n blocks. The bit lines (BL, BLB) in each block are connected with an I/O bus formed across the bank through a sense amplifier (S/A) and an I/O circuit configured in a pair with each block.

In reading data, the data read from each memory cell is transmitted to the sense amplifier (S/A) and the I/O circuit using the bit lines (BL, BLB) thereby to output data to an I/O bus. Data are written in the memory cells by transmitting the data in the I/O bus to the bit lines (BL, BLB) using the sense amplifier (S/A) and the I/O circuit.

SUMMARY OF THE INVENTION

An object of the present invention is to provide a cache memory in which high-speed storage is possible with a reduced area of a memory cell or a memory array, and a semiconductor apparatus comprising such a cache memory.

Another object of the invention is to provide a high-speed cache memory and a semiconductor apparatus comprising such a cache memory with a reduced power consumption.

In the case where a memory according to the prior art 1 is used as a data array of a cache memory, the storage in the cache memory cannot be processed at high speed. The reason will be described below.

The storage is a process in which data are written after a data array receives a hit signal constituting a write permit signal from a tag array. The time required for this process is the sum of "the time before establishment of a hit signal" and "the time for writing the data". The "time before establishment of a hit signal" is the sum of the time required for reading the tag array and the time required for comparing the address read from the tag array with the tag address. As a result, the storage process is lower in speed than the operation of reading from or writing into an ordinary memory not using the establishment of a hit signal. In view of the fact that the tag array and the data array can be accessed at the same time, the time of processing the loading from a cache memory equal to that of the operation of reading from an ordinary memory can be achieved. Specifically, in the case where the operating frequency of a microprocessor is comparatively low (say, 20 to 30 MHz or less), the resulting long machine cycle makes it possible to realize the storage in one cycle. With the increase in the operating frequency of the microprocessor (say, to 50 MHz or more with one machine cycle of 20 msec or less), however, the storage cannot be realized in one cycle. Especially in the case where the cache memory is accessed with an output address of a conversion buffer for converting a logic address into a physical address, the establishment of a hit signal is slower and the storage in one cycle is harder to realize. In the conventional cache memory built in the microprocessor adapted for high-frequency operation, therefore, the storage is effected in two cycles and the loading in one cycle. In the case where the microprocessor employs a pipeline processing scheme, the memory access stage requires two cycles for storage, with the result that the pipeline is disturbed, thereby constituting a bottleneck to an improved speed of the microprocessor. In view of this, the memory access stage always has two cycles, i.e., the number of pipeline stages is increased in order to prevent the pipeline from being disturbed. An increased number of pipeline stages, however, leads to the problem of an increased power consumption.

The time required before establishment of a hit signal is a stumbling block to an increased storage speed. The present inventor has studied a method of writing data in a data array before establishment of a hit signal as a method of processing the storage at high speed. In such a case, no problem is posed when the hit signal represents a "hit" indicating the write permission at the time point when the hit signal is established after the write operation. In the case where the hit signal represents a "mishit", however, it is necessary to restore the value before writing the data in the data array. The result is the necessity of reading and holding the data at the write position before the write operation.

In other words, in the case where the storage is effected ignoring the hit signal to increase the speed of storage process, the two operations of reading and writing data are required to be performed continuously in a single cycle. Unless this continuous read and write operation cannot be performed at high speed, a high-speed storage is impossible to achieve even if the hit signal is ignored.

In the memory of the prior art 1, the operating speed is increased by a reduced capacity of the bit lines when the write operation is performed as a storage operation after reading data at the same address. The need of performing the write operation after a complete read operation using the bit lines and the I/O bus, however, lengthens the processing time as compared with the normal read or write operation. In other words, the read operation requires one cycle and the write operation one cycle, thus requiring a total of two cycles for storage.

JP-A-4-85789 (hereinafter referred to as the prior art 2), on the other hand, discloses a memory in which what is called a dual-port memory cell connected to a read address signal line, a write address signal line, a read data line and a write data line is used in such a manner that the read side discharges while the write side is precharging, and vice versa, thus apparently executing the read and write operations at the same time. The use of the dual port memory cell, however, poses the problem of an increased area of the memory cell and the memory cell area. Further, the increased area increases the bit line capacity, resulting in a longer memory access time and a longer memory cycle time.

JP-A-3-216892 (U.S. Pat. No. 5,387,827) (hereinafter referred to the prior art 3), JP-A-3-3195 (hereinafter referred to as the prior art 4) and IEEE Journal of Solid-State Circuits, Vol. 23, No. 5, October 1988, pp. 1048–1053 (hereinafter referred to as the prior art 5), on the other hand, disclose a memory in which a common read line and a common write line are connected through a bit line and a MOS transistor. None of the prior arts 3, 4 and 5, however, has the description of the possibility of concurrent execution of the read and write operations. All the prior arts 3, 4 and 5 concern a memory of BiCMOS (Bipolar CMOS (Complementary Metal Oxide Semiconductor)). The prior art 4 which has no direct description of the BiCMOS, however, cites the prior art 5 as a conventional technique. The use of the BiCOMS circuit can realize a high-speed memory at the sacrifice of a larger power consumption than the memory of the CMOS circuit.

It is important to realize a high-speed cache memory only with a CMOS circuit. If the power consumption of circuits integrated in a single semiconductor device is not more than 1.5 W, the resin sealing with a resin mold technique or the like becomes possible, and the cost of the semiconductor device can be reduced considerably as compared with ceramic sealing used for a semiconductor device having a high power consumption.

According to the present invention, a high-speed storage process of a cache memory is realized by suppressing the increase in the area of the memory cell or the memory cell array.

Also, according to the invention, a high-speed cache memory is realized without increasing the power consumption.

The above and other objects, features and advantages will be made apparent by the detailed description taken below in conjunction with the accompanying drawings.

Representative aspects of the present invention disclosed in this specification are briefly described below.

A semiconductor memory apparatus comprises a memory array (BANK1) including a plurality of word lines (WL), a plurality of bit lines (LBL) and a plurality of memory cells (CELL) arranged at the intersections between the word lines (WL) and the bit lines (LBL), at least a first global bit line (RGBL) connected to a sense amplifier (104), at least a second global bit line (WGBL) connected to a write amplifier (102), and a selection circuit (YSW1) for selectively connecting the bit lines (LBL) to the first global bit line (RGBL) or to the second global bit line (LBL). The first global bit line (RGBL) and the second global bit line (WGBL) are arranged on the memory array (BANK1). When reading data from the memory array (BANK1), the bit lines (LBL) are electrically connected to the first global bit line (RGBL), and the data are output through the sense amplifier (104). When writing the data in the memory cell array (BANK1), on the other hand, the data are input to the second global bit line (WGBL) through the write amplifier (102) with the bit lines (LBL) electrically connected to the second global bit line (WGBL).

At the time of storage when the read and write operations are carried out successively, data are read out using the read global bit line (RGBL) concurrently with the charge and discharge operation of the write global bit line (WGBL). As a result, the write operation can be completed simply by charging and discharging only the local bit lines (LBL) having a small capacity after starting the write operation upon completion of the read operation, thereby making possible a high-speed write operation.

Specifically, in view of the fact that the bit lines can be charged and discharged concurrently for the read and write operations, the continuous read and write operations can be improved in speed and can be completed in a cycle. A one-cycle storage can thus be realized.

Also, since a continuous read and write operation is possible at high speed, the read cycle time is not lengthened even when the cycle time of the read operation is equalized with the cycle time of the continuous write operation. Also, if the cycle time of the read operation is the same as the cycle time of the continuous write operation, a memory such as the microprocessor is more convenient to use as a device to be accessed. Therefore, it is possible to provide a memory in which the cycle time of the read operation is equal to the cycle time of the continuous read and write operation. In other words, the timing specification of a memory can define the same cycle time of the read operation as the cycle time of the continuous read and write operation.

A representative effect obtained by the invention disclosed in this specification are briefly described below.

Specifically, in view of the fact that the bit lines can be charged and discharged concurrently for read and write operations, the continuous read and write operation can be improved in speed and can be completed in a single cycle.

DESCRIPTION OF THE PREFERRED EMBODIMENTS

A semiconductor memory apparatus according to several preferred embodiments of the present invention will be described below with reference to the drawings.

<Embodiment 1>

Figure 1:
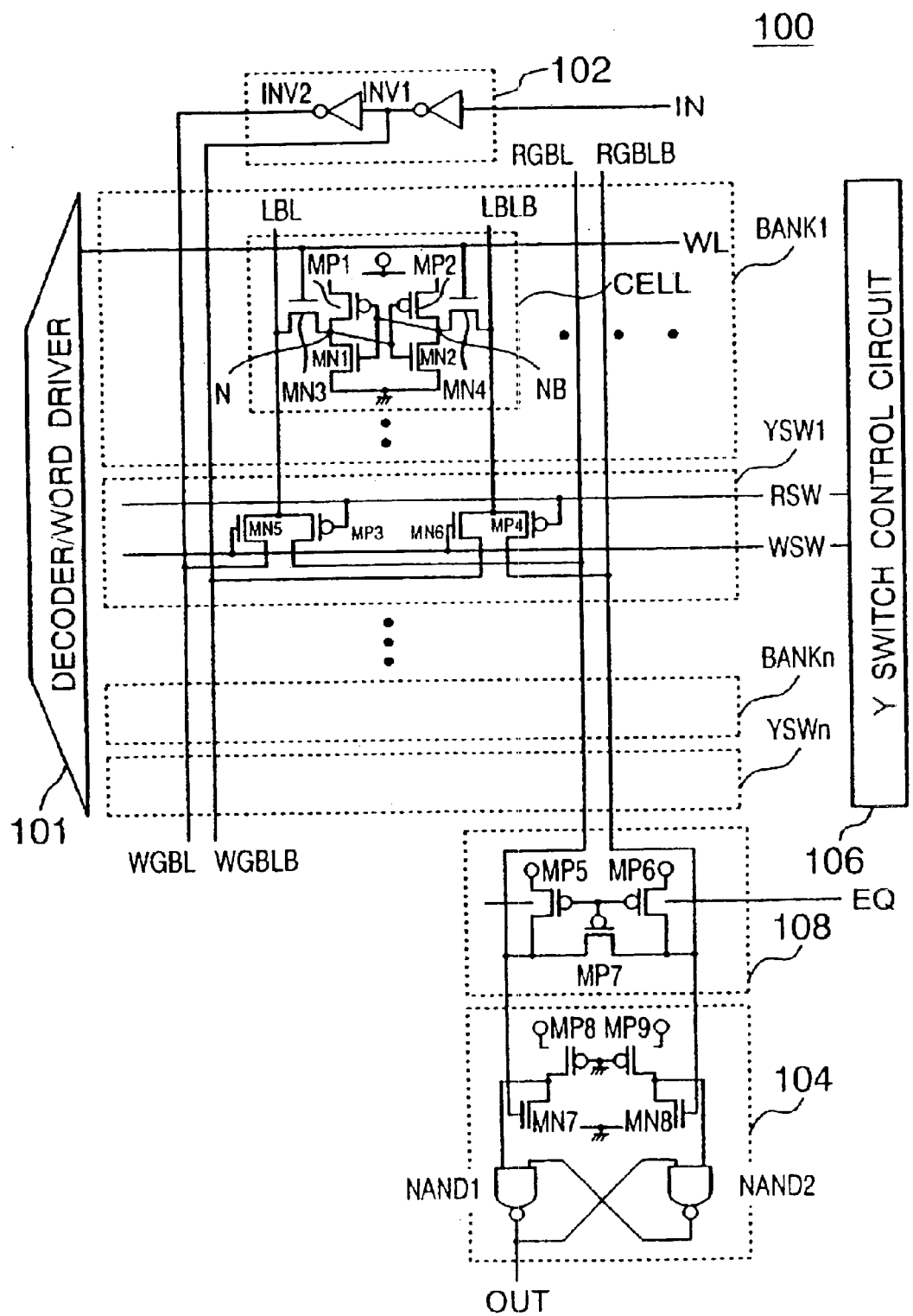
FIG. 1 is a circuit diagram showing a semiconductor memory apparatus according to a first embodiment of the invention.

FIG. 1 is a circuit diagram showing a semiconductor memory apparatus according to a first embodiment of the invention. A semiconductor memory apparatus 100 is formed on a single semiconductor substrate of single crystal silicon or the like using the technique of fabricating a semiconductor integrated circuit. A plurality of memory cells CELL are arranged in matrix to constitute a memory array. The memory array is divided into n banks (BANK1 to BANKn).

The memory cells CELL each include a flip-flop (having P-channel MOS transistors MP1, MP2, and N-channel transistors MN1, MN2) with a pair of CMOS inverters having input and output terminals thereof connected to each other, respectively, and N-channel MOS transistors MN3, MN4 for selectively connecting the nodes N and NB of the flip-flop to the local bit lines (LBL, LBB). The gates of the N-channel MOS transistors MN3, MN4 are connected with a word line WL.

The local bit lines (LBL, LBLB) making up internal bit lines of each bank are connected to global bit lines (RGBL, RGBLB, WGBL, WGBLB) formed in parallel with the local bit lines (LBL, LBLB) across the banks through Y switches (YSW1 to YSWn) formed adjacently to the banks. The global bit lines each are divided into read bit lines (RGBL, RGBLB) and write bit lines (WGBL, WGBLB). The global bit lines (RGBL, RGBLB) for reading data are connected to the local bit lines (LBL, LBLB) through the P-channel MOS transistors MP3, MP4 of the Y switches (YSW1 to YSWn) on the one hand and to a sense amplifier latch circuit 104 on the other hand. The gates of the P-channel MOS transistors MP3, MP4 are connected with a signal line RSW. At the time of reading data, the local bit lines (LBL, LBLB) are precharged to "HIGH" level by a precharge circuit 108 temporarily and simply oscillates at about "HIGH" level. It is thus possible to transmit the signals of the local bit lines (LBL, LBLB) to the data-reading global bit lines (RGBL, RGBLB) only through the P-channel MOS transistors.

The sense amplifier latch circuit 104 includes a differential sense amplifier having P-channel MOS transistors MP8, MP9 and N-channel MOS transistors MN7, MN8, and a latch circuit including NAND circuits NAND1, NAND2. The gates of the N-channel MOS transistors MN7, MN8 are connected with the global bit lines (RGBL, RGBLB). The gates of the P-channel MOS transistors MP8, MP9 are connected to the ground potential VSS.

The global bit lines (WGBL, WGBLB) for writing data are connected to the local bit lines (LBL, LBLB) through the N-channel MOS transistors MN5, MN6 of the Y switches (YSW1 to YSWn) on the one hand and to a write amplifier circuit 102 on the other hand. The gates of the N-channel MOS transistors MN5, MN6 are connected with a signal line WSW. At the time of writing data, a "LOW" signal of the global bit lines (WGBL, WGBLB) for writing data is required to be transmitted accurately to the local bit lines (LBL, LBLB). Since the "HIGH" signal can be reduced somewhat in level without any problem, however, the local bit lines (LBL, LBLB) and the data-writing global bit lines (WGBL, WGBLB) can be connected to each other only by th N-channel MOS transistors.

The write amplifier circuit 102 includes inverter circuits INV1, INV2. Also, a decoder/word driver 101 is a circuit for selecting a word line of a given bank. A Y switch control circuit 106 is a circuit for controlling the Y switches (YSW1 to YSWn). A precharge circuit 108 is connected to the global bit lines (RGBL, RGBLB) and includes P-channel MOS transistors MP5, MP6, MP7. A signal line EQ is connected to the gates of the P-channel MOS transistors MP5, MP6, MP7. Also, write data are input from a signal line IN, and read data are output from a signal line OUT.

Now, the operation of a circuit according to this embodiment will be explained. At the time of reading data, the local bit lines (LBL, LBLB) and the read global bit lines (RGBL, RGBLB) of a given one of the banks are connected to each other through Y switches YSWi (i: 1 to n). At the time of writing data, on the other hand, the local bit lines (LBL, LBLB) and the write global bit lines (WGBL, WGBLB) are connected to each other through Y switches YSWi.

Figure 2:
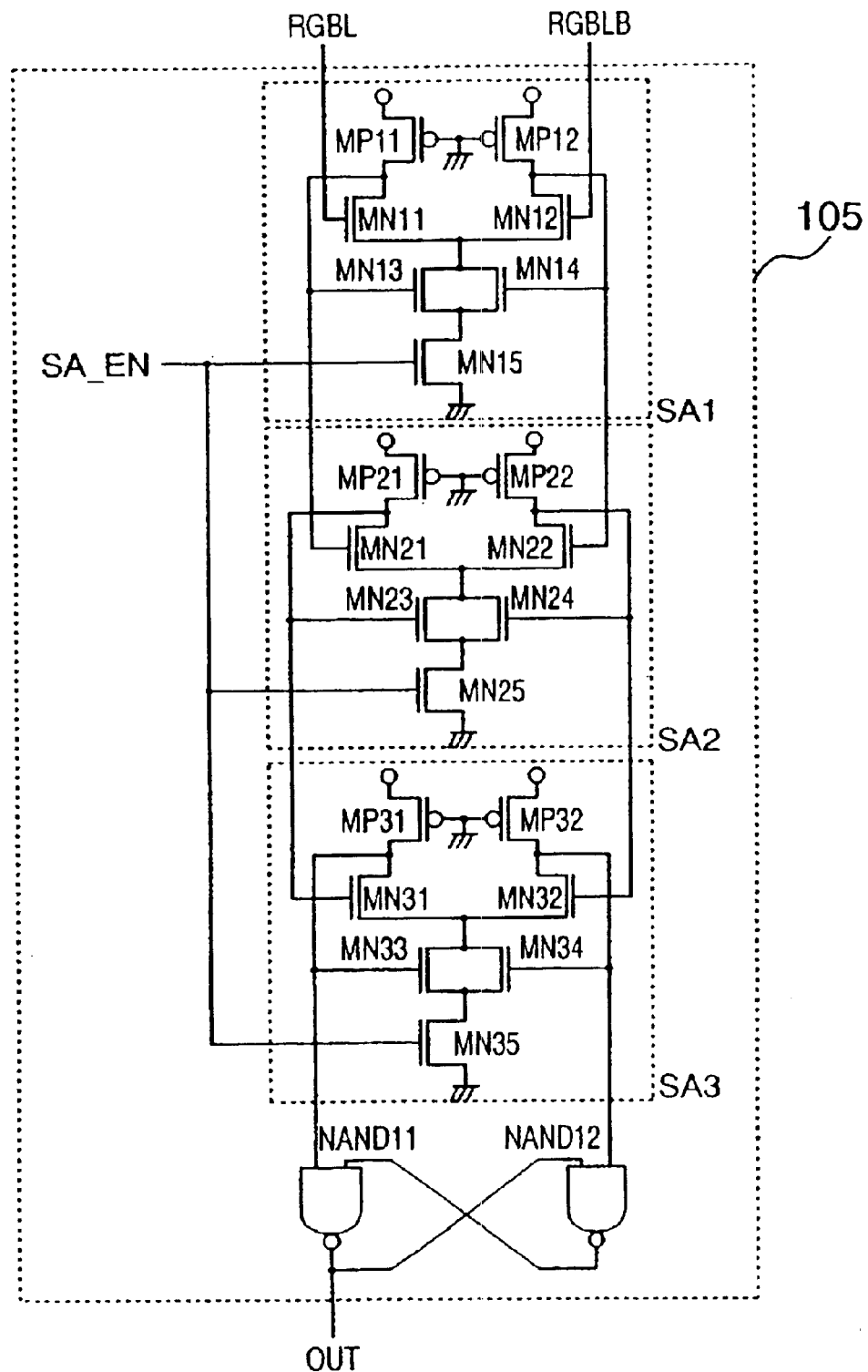
FIG. 2 is a circuit diagram of a sense amplifier latch circuit according to another embodiment.

The sense amplifier latch circuit 104 can be replaced with a sense amplifier latch circuit 105 as shown in FIG. 2. Specifically, differential sense amplifiers SA1, SA2, SA3 can be configured in three stages in series to achieve a high speed. The sense amplifier SA1 includes P-channel MOS transistors MP11, MP12 and N-channel MOS transistors MN11, MN12, MN13, MN14, MN15. The global bit lines (RGBL, RGBLB) are connected to the gates of the N-channel MOS transistors MN11, MN12 of the sense amplifier SA1. The sense amplifiers SA2, SA3 have a configuration similar to that of the sense amplifier SA1. Also, power consumption can be reduced by turning on (to "HIGH" level) a sense amplifier enable signal SA_EN only when the value of the global bit lines (RGBL, RGBLB) is amplified. The sense amplifier latch circuit 105 (hereinafter referred to simply as the differential sense amplifier), unlike the sense amplifier latch circuit 104 (hereinafter referred to simply as the latch-type sense amplifier), requires no consideration about a bit-line offset voltage margin. Specifically, it is not necessary to take into consideration the bit-line offset voltage margin attributable to the threshold voltage variations of the MOS transistors making up the latch-type sense amplifier due to the variations in the fabrication process. Therefore, the enable timing of the sense amplifier enable signal SA_EN need not be taken into account (a timing-free operation can be achieved) unlike in the latch-type sense amplifier. In other words, it is not necessary to determine the enable timing of the sense amplifier enable signal SA_EN by taking the bit-line offset voltage margin into consideration. Thus the enable timing of the sense amplifier enable signal SA_EN for the differential sense amplifier can be advanced forward of that of the latch-type sense amplifier. In this way, the differential sense amplifier can be delayed less than the latch-type sense amplifier.

Figure 3:
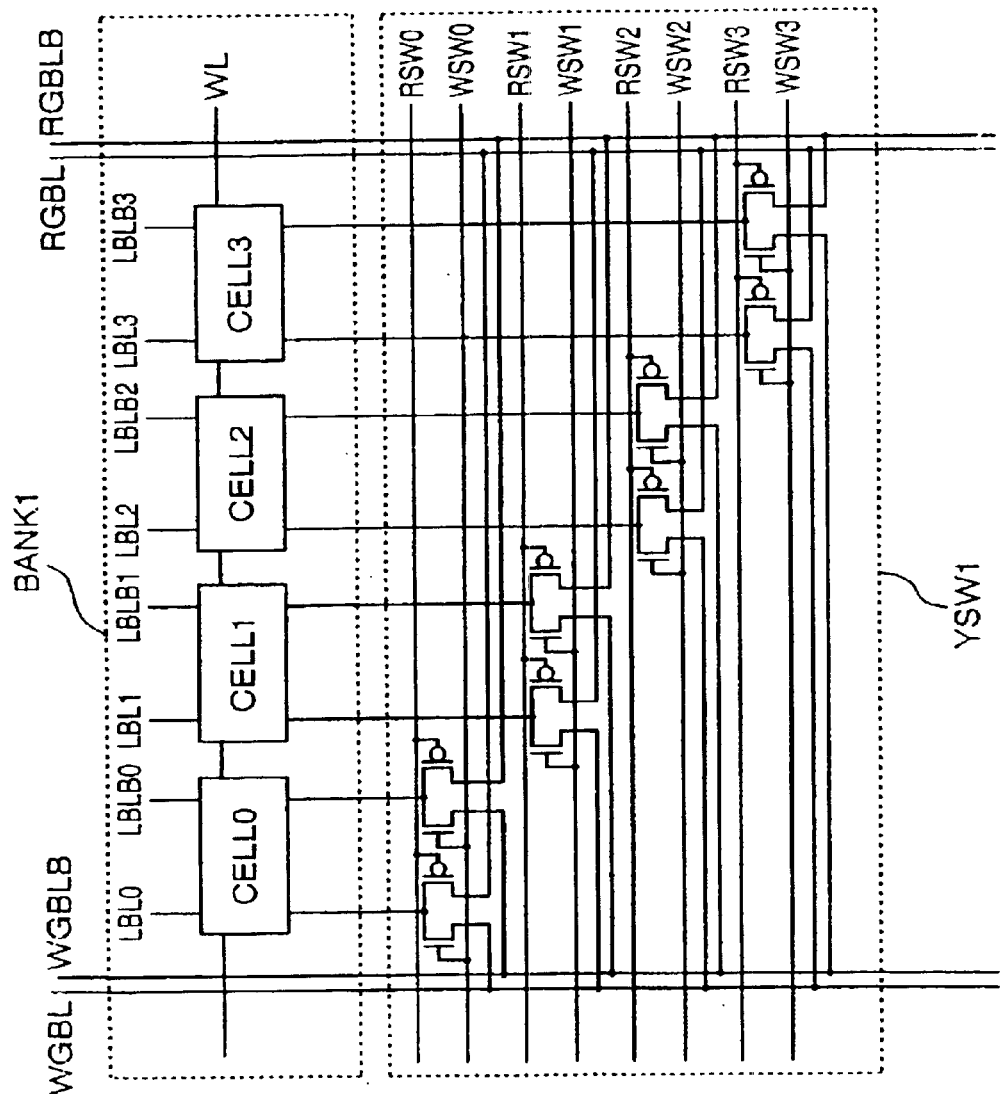
FIG. 3 is a circuit diagram showing the case in which a pair of global bit lines are formed for each four pairs of local bit lines.

FIG. 3 is a diagram exaggerating and showing the BANK1 and the Y switch YSW1 in more detail than the remaining parts. A pair of global bit lines (RGBL, RGBLB) for reading data and a pair of global bit lines (WGBL, WGBLB) for writing data are arranged for each four pairs of local bit lines (LBL0, LBLB0; LBL1, LBLB1; LBL2, LBLB2; LBL3, LBLB3). One of the four pairs of the local bit lines (LBL0, LBLB0; LBL1, LBLB1; LBL2, LBLB2; LBL3, LBLB3) is selected by the Y switch YSW1 and connected to the data-reading global bit lines (RGBL, RGBLB) and the data-writing global bit lines (WGBL, WGBLB) thereby to read and write the data. Signal lines RSW0, WSW0, RSW1, WSW1, RSW2, WSW2, RSW3, WSW3 are output from the Y switch control circuit 106 and applied to the gates of the MOS transistors of the Y switch YSW1.

Figure 4:
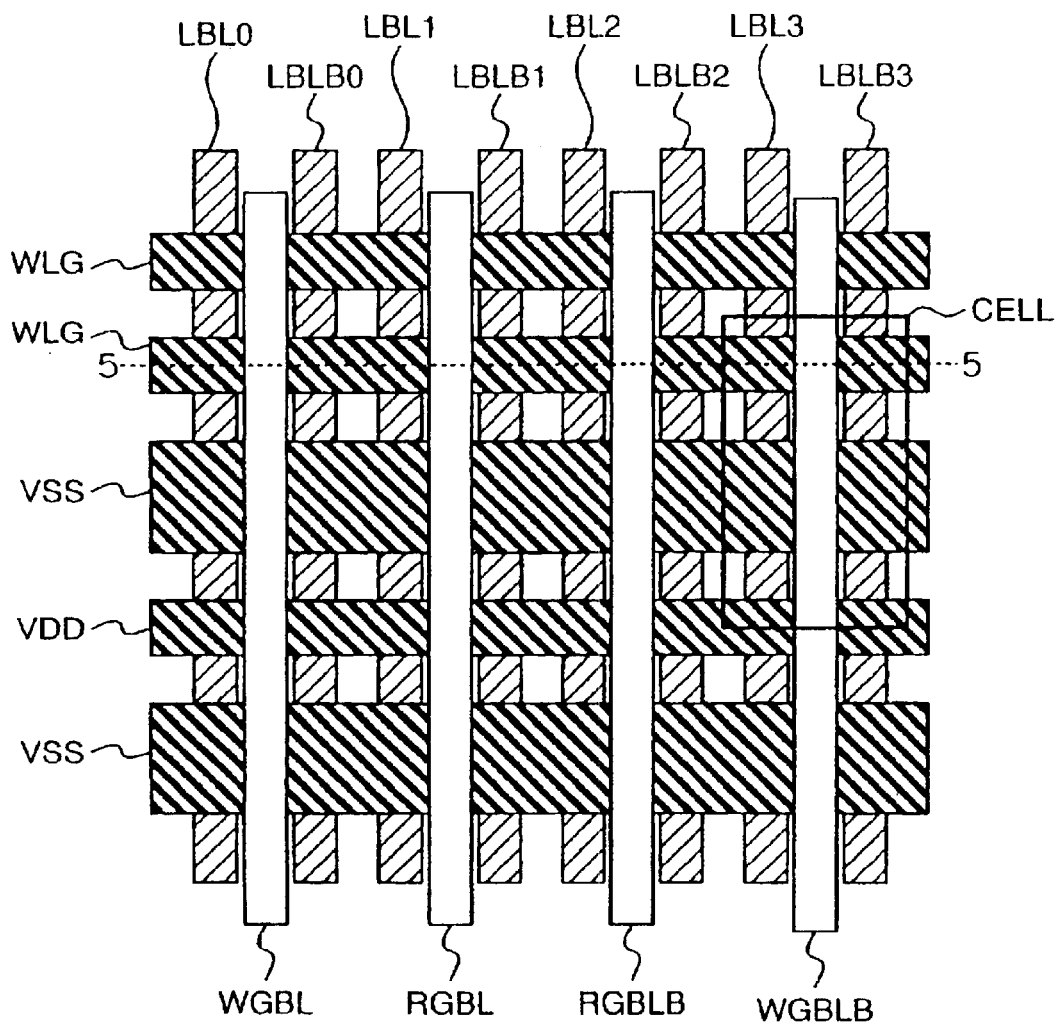
FIG. 4 is a layout of a memory mat section of a semiconductor memory apparatus according to the first embodiment.
Figure 5:
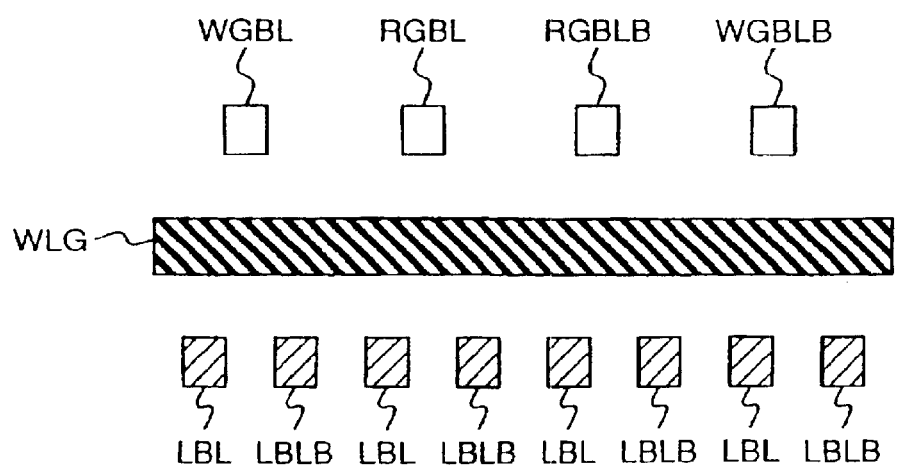
FIG. 5 is a sectional view of the memory mat section of a semiconductor memory apparatus according to the first embodiment.

FIG. 4 shows a layout of metal layers of a memory mat section in which a pair of data-reading global bit lines (RGBL, RGBLB) and a pair of data-writing global bit lines (WGBL, WGBLB) are laid for each four pairs of local bit lines (LBL0, LBLB0; LBL1, LBLB1; LBL2, LBLB2; LBL3, LBLB3). Also, FIG. 5 is a sectional view taken in line AB in FIG. 4. The local bit lines (LBL0, LBLB0, LBL1, LBLB1, LBL2, LBLB2, LBL3, LBLB3) are configured of a second-layer metal (metal wiring). A reinforcing line WLG for reducing the resistance of the word line is made of a third-layer metal. The ground line VSS and the power line VDD are configured of a third-layer metal. The data-reading global bit lines (RGBL, RGBLB) are configured of a fourth-layer metal. The data-writing global bit lines (WGBL, WGBLB) are also configured of the fourth-layer metal. Though not shown, the first-layer metal is used for the memory cell section. The region defined by the thick line defines a single memory cell CELL.

The global bit lines (RGBL, RGBLB, WGBL, WGBLB) are formed at the rate of one for each memory cell column (a pair of bit lines LBL0, LBLB0, for example). It is thus possible to improve the operation speed by reducing the line capacitance of the global bit lines RGBL, RGBLB, WGBL, WGBLB.

Figure 6:
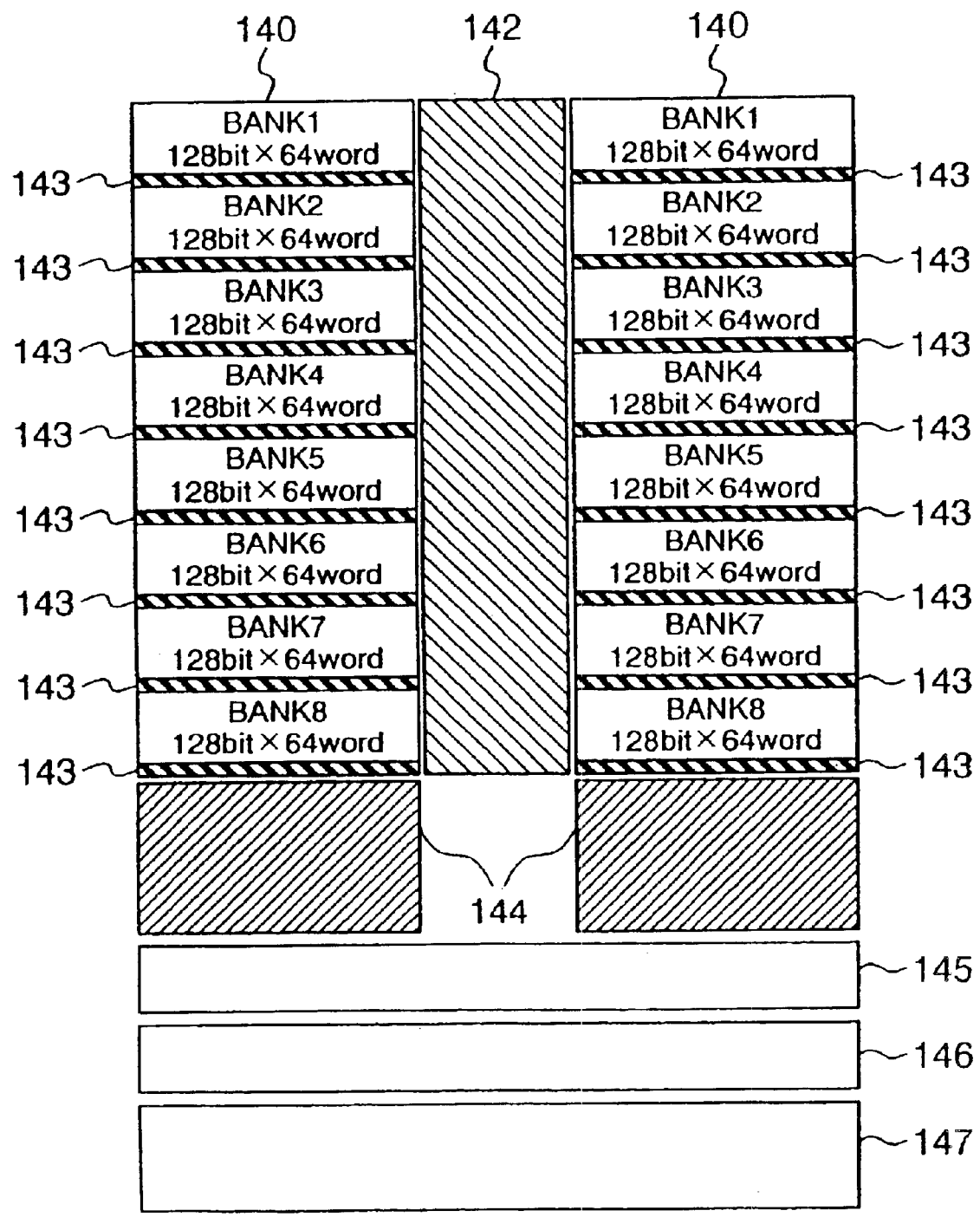
FIG. 6 is a diagram showing a layout image of a 16-KB memory using a semiconductor memory apparatus according to the first embodiment.

FIG. 6 shows a layout image of a 16-KB memory configured using this circuit technique. A region 140 is roughly divided into two memory arrays. Each memory array in turn is divided into contiguously-arranged eight banks (BANK1 to BANK8). Regions 143 each represent a Y switch YSW arranged adjacently to the corresponding one of the eight banks (BANK1 to BANK8), respectively. A region 142 has arranged therein the decoder, the word driver 101 and the Y switch control circuit 106. Regions 144 each have arranged therein a sense amplifier latch circuit 104 and a write amplifier circuit 102. A region 145 represents a wiring area for a signal line OUT for producing the read data, and a region 146 is a wiring region for a signal IN for inputting the write data. A region 147, on the other hand, has arranged therein a predecoder and other control circuits not shown in FIG. 1. The width of input/output data of this memory is 32 bits, and the address thereof is 12 bits in length.

Now, explanation will be made about the storage operation (the continuous operation of reading from and writing into the same address).

Figure 7:
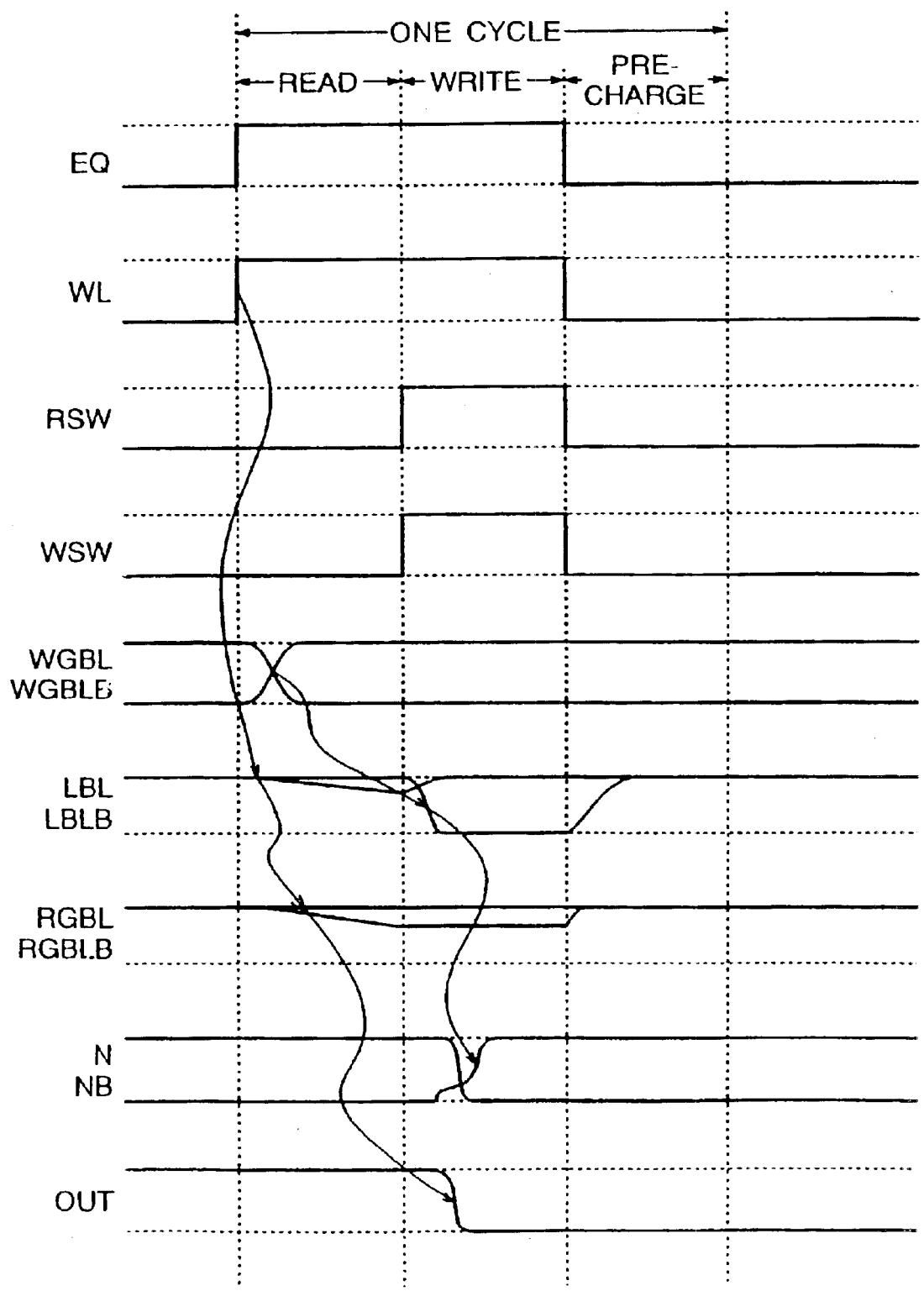
FIG. 7 is a diagram showing an operation waveform for storage operation of a semiconductor memory apparatus according to the first embodiment.

FIG. 7 shows an operation waveform for storage in the semiconductor memory apparatus shown in FIG. 1. At the time of storage, data are read first, followed by being written.

Before starting the storage operation, the read global bit lines (RGBL, RGBLB) and the local bit lines (LBL, LBLB) are precharged to "H" ("HIGH") level by a precharge circuit 108 as the signal line EQ is set to "L" ("LOW") level and the control signal RSW for the Y switches (YSW1 to YSWn) to "L" level.

In the read operation, the signal line EQ is first set to "H" to suspend the precharge, while at the same time setting the word line WL to "H". The precharged local bit lines (LBL, LBLB) thus are discharged by the memory cell CELL thereby to generate a potential difference. Since the control signal RSW is set to "L", the P-channel MOS transistors of the Y switches (YSW1 to YSWn) are turned on. Consequently, the local bit lines (LBL, LBLB) and the read global bit lines (RGBL, RGBLB) are connected to each other, so that the potential difference of the local bit lines (LBL, LBLB) generated by the memory cell CELL is transmitted to the read global bit lines (RGBL, RGBLB). This potential difference is further transmitted to the sense amplifier latch circuit 104 and amplified by the sense amplifier. The data are thus output on the signal line OUT.

At the time point when a potential difference is transmitted to the sense amplifier, the control signal RSW of the Y switches (YSW1 to YSWn) is set from "L" to "H", so that the P-channel MOS transistors of the Y switches (YSW1 to YSWn) are turned off. The local bit lines (LBL, LBLB) and the read global bit lines (RGBL, RGBLB) are thus separated from each other. At the same time, the control signal WSW of the Y switches (YSW1 to YSWn) is set from "L" to "H", and the N-channel MOS transistors of the Y switches (YSW1 to YSWn) are turned on. Thus the local bit lines (LBL, LBLB) and the write global bit lines (WGBL, WGBLB) are connected to each other thereby to start the write operation. The write global bit lines (WGBL, WGBLB) have already completely charged and discharged during the read operation. After starting the write operation, therefore, the signal can be transmitted to the memory cell CELL and the write operation completed simply by charging and discharging only the small-capacity local bit lines (LBL, LBLB).

After complete write operation, the word line WL is set to "L", the control signal RSW to "L", the control signal WSW to "L", and the signal line EQ to "L". The read global bit lines (RGBL, RGBLB) and the local bit lines (LBL, LBLB) are thus precharged in preparation for the next cycle. In this way, the read operation, the write operation and the precharge operation are executed in a cycle.

Although FIG. 7 refers to the case where the precharge operation is performed at the end of a cycle, it can alternatively be executed before the read operation with equal effect. In other words, the description applies equally to the case in which the precharge operation is performed first in the cycle.

In the memory according to the prior art 1, the same bit line is used for the read and write operations. The charge/discharge of the bit lines for the read operation, therefore, cannot be executed at the same time as that of the bit lines for the write operation, thereby making it difficult to improve the storage speed. According to this embodiment, by contrast, the charge and discharge of the write bit lines can be completed concurrently with the read operation. Data can thus be read from and written into the same address continuously at high speed in a single cycle, thereby realizing a single-cycle storage.

Also, according to this embodiment, the memory cells CELL attached to the bit lines in operation are only 1/n in number as compared with the conventional circuit not using global bit lines. The bit line capacity thus is reduced for a higher charge/discharge speed. As a result, the read and write operations can be improved in speed. Further, the reduced bit line capacity reduces power consumption.

Furthermore, the memory cell CELL is identical to that of the prior art 1, and can be formed in a smaller size than the memory cell of what is called the dual-port memory of the prior art 2. The continuous operation of reading from and writing into the same address can thus be executed in higher speed without increasing the area of the memory array and the memory cells.

<Embodiment 2>

Figure 8:
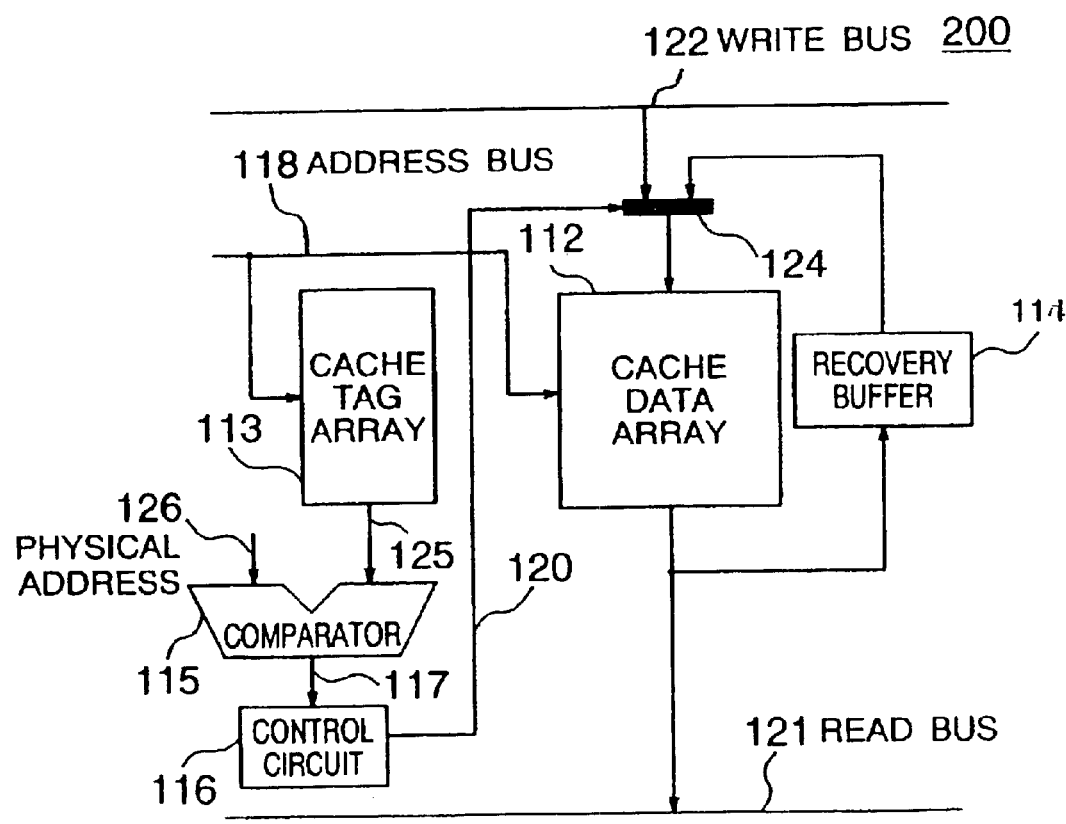
FIG. 8 is a block diagram showing a cache memory (second embodiment) using a semiconductor memory apparatus according to the first embodiment.

FIG. 8 is a block diagram of a cache memory of direct map type for a semiconductor memory apparatus according to the invention described in the first embodiment used as a data memory array. A cache memory 200 is formed on a single semiconductor substrate of single crystal silicon or the like using the technique of fabricating a semiconductor integrated circuit. A cache data array 112 is connected to a 12-bit-long address bus 118, a 32-bit-long write bus 122 and a 32-bit-long read bus 121. In the case where the memory configuration shown in FIG. 6 is employed, for example, the capacity of the cache data array 112 is 16 KB, and each line is configured of 256 bits (which is the unit used for replacing a mishit). Data are input to and output from the cache data array 112 with a 32-bit width at the time of retrieval using a cache tag array. Also, data are input to and output from the cache data array 112 with a width of 64 bits at the time of replacing a mishit A recovery buffer 114 is used for temporarily storing the data read from the cache data array 112 and is configured of a 32-bit-wide register, for example. A selector 124 is for selecting whether data is written into the cache data array 112 from the write bus 122 or from the recovery buffer 114. The selector 124 is controlled by a control signal 120.

A cache tag array 113 receives a tag address from the address bus 118 and applies a physical address 125 to a comparator 115. The comparator 115 compares the address 125 received from the cache tag array 113 with the address 126 received from an address conversion buffer TLB of a memory management unit not shown, and upon attaining coincidence therebetween, produces and applies a "H" (hit) signal as an output to the control circuit 116. Upon coincidence failure, on the other hand, a "L" (mishit) signal is produced as a hit signal 117 and applied to the control circuit 116. The control circuit 116 controls the selector 124 by the control signal 120.

Figure 9:
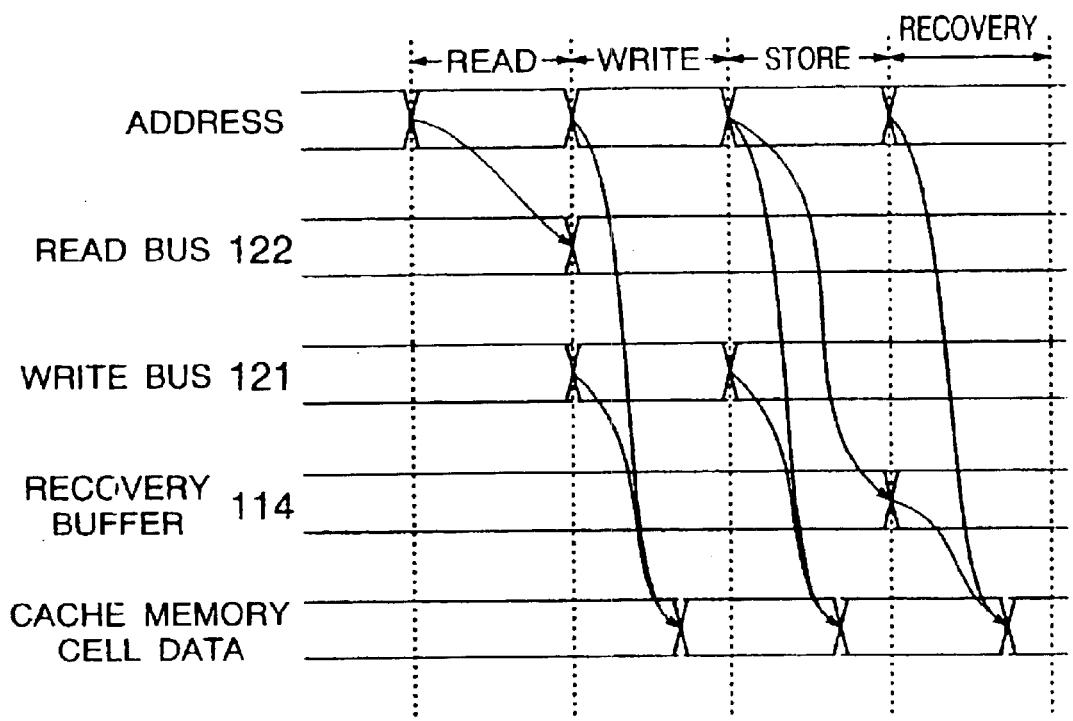
FIG. 9 is a diagram showing an operation waveform of a cache memory according to the second embodiment.

FIG. 9 shows an operation waveform of the read operation, the write operation, the storage operation and the recovery operation for writing back data into the cache data array 112 in the case where the storage hit signal is a mishit. According to this embodiment, the cache tag array 113 is accessed concurrently with the cache data array 112, and therefore the read and load operations can be regarded substantially as the same operation.

At the time of read operation, the cache data array 112 receives an address from the address bus 118 and applies a read data to the read bus 121. At the time of write operation, on the other hand, the cache data array 112 receives an address from the address bus 118 and a write data from the write bus 122, followed by writing the data.

At the time of storage, an address is received from the address bus 118 and write data from the write bus 122. The data is read from the memory cell into the recovery buffer 114 and a new data is written into the memory cell. At the time of complete storage, a hit signal 117 is established, thereby determining whether the write operation is permitted (hit) or not permitted (mishit). In the case where the hit signal 117 is a "hit", the next process can be executed without any problem. In the case where the hit signal indicates a "mishit", by contrast, the data in the cache data array 112 is required to be restored to the original state. In such a case, the recovery process described below is required.

In the recovery process, an address is received from the address bus 118 while the data of the recovery buffer 114 is input to the cache data array 112 and the data is written into the memory cell by switching the selector 124. The selector 124 is controlled by the control signal 120 output from the control circuit 116 that has received the hit signal 117. Normally, the possibility is low that the hit signal 117 is a "mishit", and therefore the requirement of executing the recovery process is very small. The storage, therefore, is normally completed in a cycle. At the time of a "mishit", on the other hand, a line (256 bits) of data is required to be replaced. The replacement job requires ten-odd cycles. In contrast, the recovery process requires only a cycle and therefore represents a negligibly small proportion.

In the conventional method of storage, data is written after the hit signal is established. Two cycles are therefore required before complete storage. According to this embodiment, in contrast, only a storage processing time smaller by one half than in the conventional method is required. In other words, the storage can be realized in one cycle like the load operation. Consequently, the memory access stage of pipelines of the microprocessor can be completed in a cycle, and therefore the high-speed performance is improved without disturbing the pipeline flow.

According to the present embodiment, the write function can be replaced with the storage function. In simplifying the control circuit, therefore, the write operation can be eliminated.

<Embodiment 3>

Figure 10:
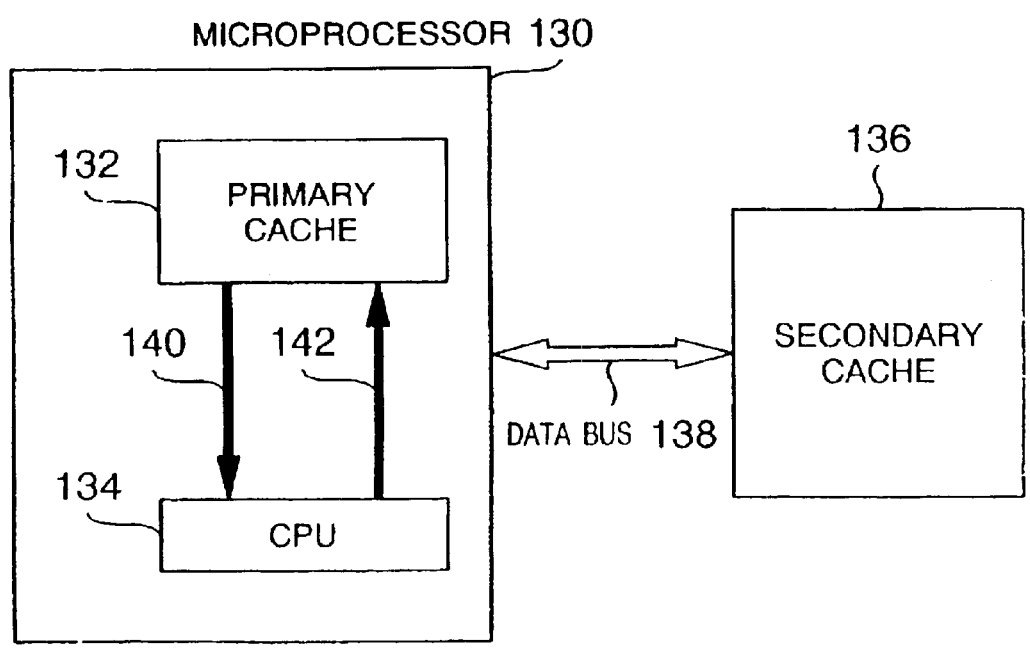
FIG. 10 is a block diagram showing a computer system (third embodiment) using a cache memory according to the second embodiment.

FIG. 10 is a block diagram showing a computer system using a cache memory according to the present invention described above as a primary cache. A microprocessor 130 is formed on a single semiconductor substrate of single crystal or the like using a technique of fabricating a semiconductor integrated circuit. The microprocessor 130 has built therein a primary cache 132 and a central processing unit (CPU) 134. Also, the microprocessor 130 is sealed with resin using a resin mold technique or the like. The microprocessor 130 and a secondary cache 136 are connected by a 32-bit-wide data bus 138. The primary cache 132 and the central processing unit 134, on the other hand, are connected by a 32-bit-wide read bus 140 and a 32-bit-wide write bus 142. In FIG. 10, only the data bus is illustrated but not any address bus or any control signal required for data transfer.

Figure 11:
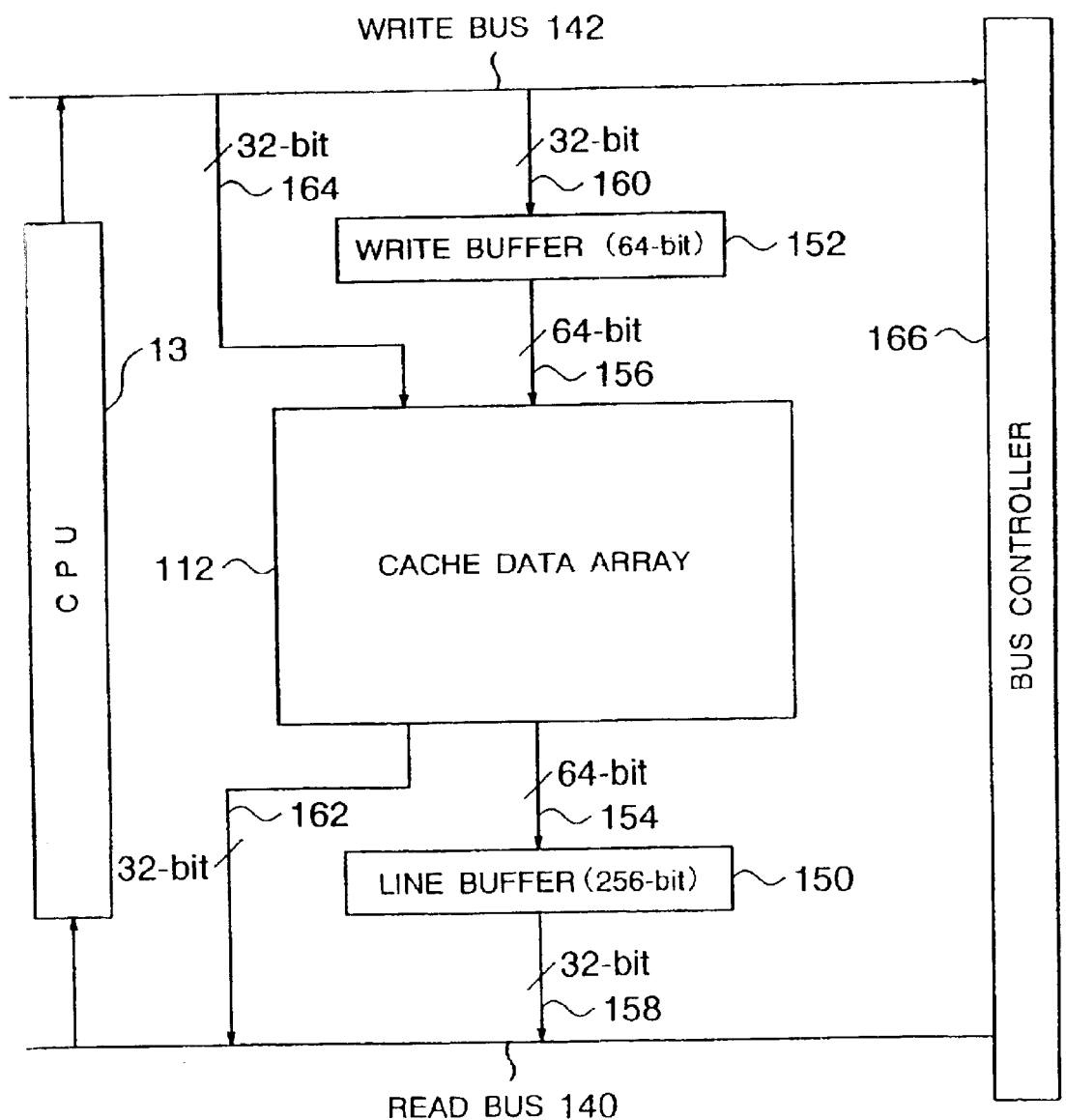
FIG. 11 is a block diagram showing the essential parts of a rewrite bus of a primary cache according to the third embodiment.

FIG. 11 shows a configuration including a buffer required for replacing the data of the cache data array 112 in the primary cache 132. The write bus 142 and the read bus 140 are connected to the central processing unit 134 and the bus controller 166, which in turn is connected to the data bus 138. Data are input into and output from the cache data array 112 with a width of 32 bits at the time of retrieval using the cache tag array. Also, data are input into and output from the cache data array 112 with a width of 64 bits at the time of replacing a mishit. The width of data input and output is differentiated depending on whether one or both of the two banks i (i: 1 to 8) of the memory array 140 are selected. In the case where only one bank is selected, data are input and output with a width of 32 bits. If the two banks are selected, on the other hand, the data input and output width is 64 bits.

In the case where data are replaced between the primary cache and the secondary cache, the data in the cache data array 112 are read out to the line buffer 150 through the buffer 154, while at the same time writing the data of the secondary cache 136 into the cache data array 112 through the write buffer 152 and the bus 156. Each line of the cache data array 112 represents 256 bits, and the buses 154, 156 are 64 bits in width. Therefore, the read and write operation can be completed in four cycles per line.

In an application of the conventional memory to the cache data array 112, on the other hand, the read and write operation requires eight cycles per line. As a result, the operation time (number of cycles) of the cache data array according to the present embodiment is reduced by one half as compared with the prior art. It is thus possible to assign another job to the primary cache. Otherwise, power consumption can be reduced.

<Embodiment 4>

The first embodiment shows the case in which the continuous data read and write operation into and from the same address can be accomplished in a cycle. Alternatively, the read operation and the write operation can be executed for different addresses, respectively. This operation will be explained with reference to the fourth embodiment below.

Figure 12:
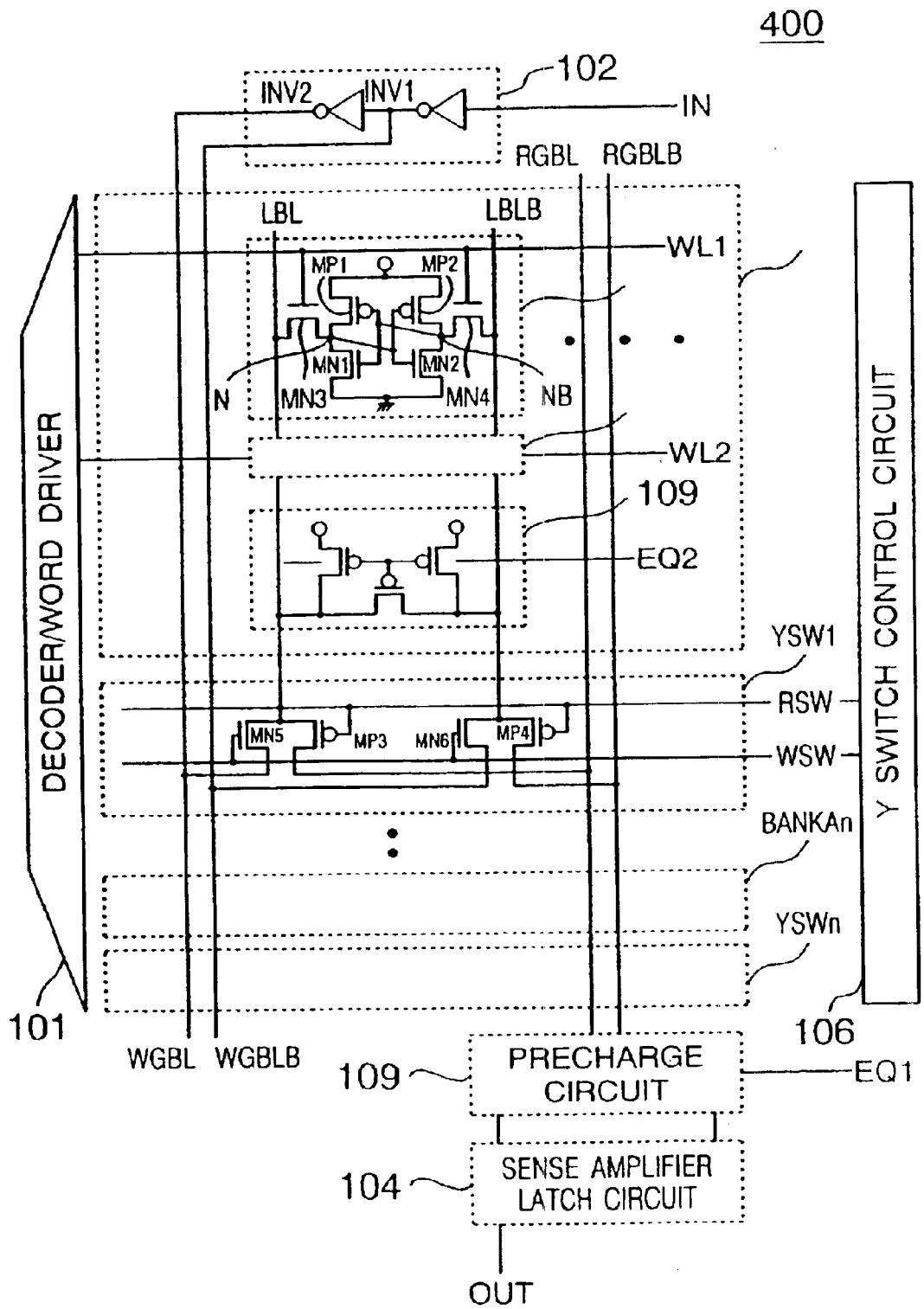
FIG. 12 is a circuit diagram showing a semiconductor memory apparatus according to a fourth embodiment.

FIG. 12 is a circuit diagram showing a semiconductor memory apparatus according to another embodiment of the invention. A semiconductor memory apparatus 400 is similar to the semiconductor memory apparatus 100 of the first embodiment except that, unlike the semiconductor memory apparatus 100 of the first embodiment, the semiconductor memory apparatus 400 includes a precharge circuit 108 connected to the local bit lines (LBL, LBLB) in the banks (BANKA1 to BANKAn). FIG. 12, however, also shows a memory cell CELL2 selected by the word line WL2. In view of the fact that the precharge circuit 108 is connected to the local bit lines (LBL, LBLB) in the banks, the local bit lines (LBL, LBLB) can be precharged at higher speed than in the semiconductor memory apparatus 100 of the first embodiment. As a result, the precharge time can be shortened for a reduced cycle time. Further, like in the semiconductor memory apparatus 100 of the first embodiment, the sense amplifier latch circuit 104 can be replaced with the sense amplifier latch circuit 105 shown in FIG. 2.

Figure 13:
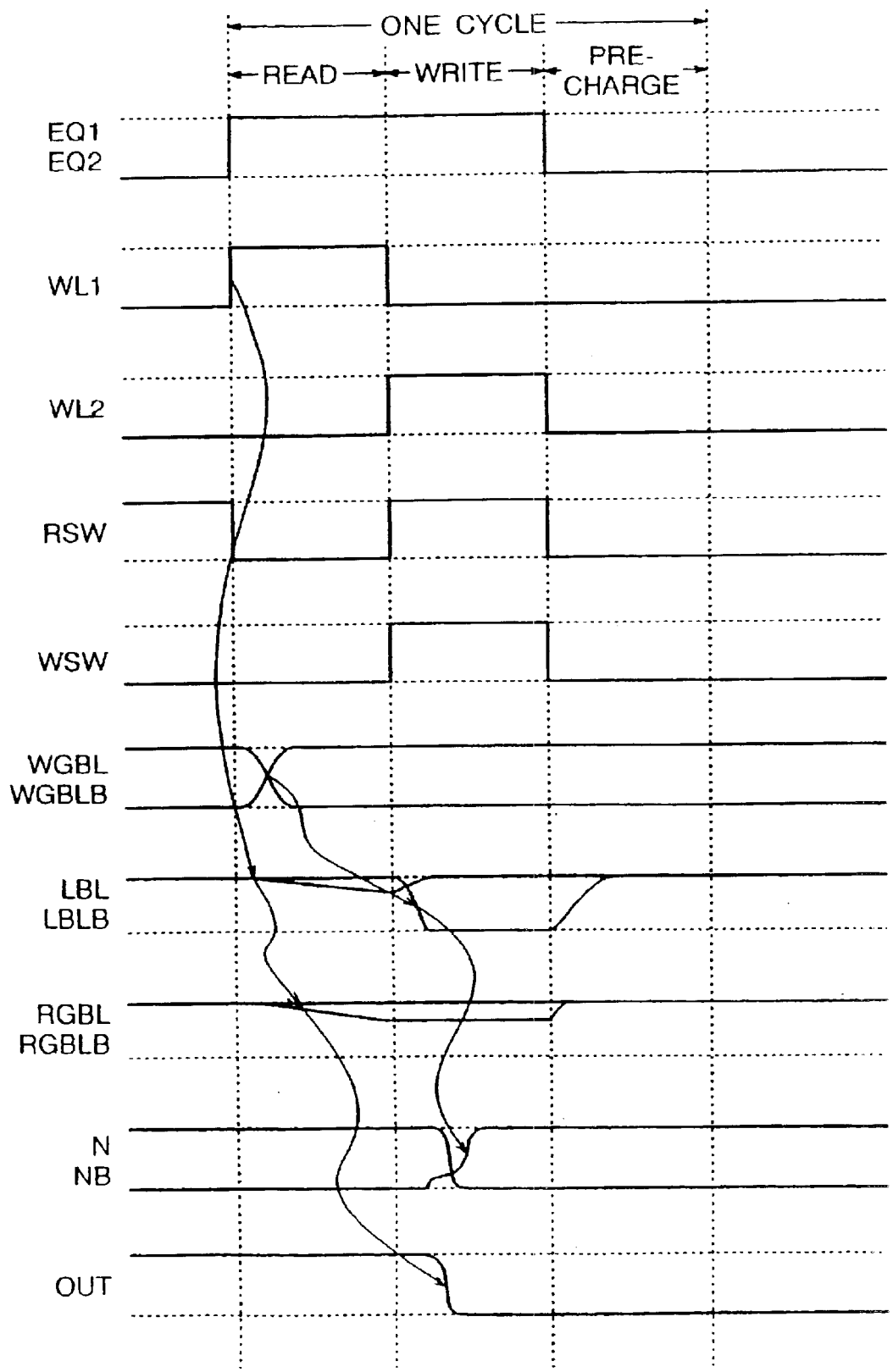
FIG. 13 is a diagram showing an operation waveform of a semiconductor memory apparatus according to the fourth embodiment.

FIG. 13 shows a waveform of the continuous read and write operation of the semiconductor memory apparatus 400. First, data are read from the memory cell CELL1, immediately followed by writing the data into the memory cell CELL2.

Before starting the operation, the read global bit lines (RGBL, RGBLB) and the local bit lines (LBL, LBLB) are precharged to "H" by the precharge circuits 108, 109 as the signal lines EQ1, EQ2 are set to "L".

In the read operation, first, the signal lines EQ1, EQ2 are set to "H" to suspend the precharge operation. At the same time, the word line WL1 is set to "H", so that the precharged local bit lines (LBL, LBLB) are discharged by the memory cell CELL1 thereby to generate a potential difference. Simultaneously with the rise of the word line WL1, therefore, the control signal RSW of the Y switches (YSW1 to YSWn) is turned from "H" to "L", and the local bit lines (LBL, LBLB) come to be connected with the read global bit lines (RGBL, RGBLB), so that the potential difference of the local bit lines (LBL, LBLB) generated by the memory cell CELL1 is transmitted to the read global bit lines (RGBL, RGBLB). Further, this potential difference is transmitted to the sense amplifier latch circuit 104 and amplified by a sense amplifier with the result that the data are output on the signal line OUT.

At the time point when the potential difference is transmitted to the sense amplifier, the word line WL1 turns from "H" to "L", and the data read operation from the memory cell CELL1 is suspended. At the same time, the control signal RSW of the Y switches (YSW1 to YSWn) is turned from "L to "H", and the P-channel MOS transistors of the Y switches (YSW1 to YSWn) are turned off. The local bit lines (LBL, LBLB) and the read global bit lines (RGBL, RGBLB) are thus separated from each other. Immediately after that, the word line WL2 is set to "H", and data are written into the memory cell CELL2. Simultaneously with the rise of the word line WL2, the control signal WSW for the Y switches (YSW1 to YSWn) is turned from "L" to "H". The N-channel MOS transistors of the Y switches (YSW1 to YSWn) thus are turned on, and the local bit lines (LBL, LBLB) are connected with the write global bit lines (WGBL, WGBLB) thereby to start the write operation. The write global bit lines (WGBL, WGBLB) have already been charged or discharged during the read operation. After starting the write operation, therefore, the signal is transmitted to the memory cell CELL2 and the write operation is completed fast if only the local bit lines (LBL, LBLB) of small capacity are charged or discharged. After complete write operation, the word line WL2 is turned from "H" to "L". At the same time, the control signal WSW for the Y switches (YSW1 to YSWn) is set from "H" to "L", so that the N-channel MOS transistors of the Y switches (YSW1 to YSWn) are turned off. The local bit lines (LBL, LBLB) are thus separated from the write global bit lines (WGBL, WGBLB). After that, the signal lines EQ1, EQ2 are turned to "L", so that the read global bit lines (RGBL, RGBLB) and the local bit lines (LBL, LBLB) are precharged to "H" by the precharge circuits 108, 109, thereby completing the operation of the complete cycle.

According to this embodiment, the read and write operations are performed for the memory cells of the same bank. A similar operation, however, can be performed also with the memory cells of different banks.

The read, write and precharge operations are executed in a cycle for the local bit lines (LBL, LBLB), the read and precharge operations are executed in a cycle for the read global bit lines (RGBL, RGBLB), and the write operation alone is executed in a cycle for the write global bit lines (WGBL, WGBLB). In other words, the global bit lines are used exclusively for the read and write operations, respectively, and the local bit lines are used for the continuous read and write operation. The precharge operation is not required, however, between the read and write operations.

Although the precharge operation performed at the end of a cycle is illustrated in FIG. 13, the precharge can be performed before the read operation. In other words, the precharge illustrated in FIG. 3 is equivalent to the precharge being executed in the beginning of the cycle.

This is accomplished by using the bank interior as a single port and the whole memory as two ports. In other words, the banks are used in the same manner as a two-port memory cell. The semiconductor memory apparatus 400 is a two-port memory capable of reading data from a given address and writing data in another address in the same cycle. The large-capacity global bit lines are used as two-port lines, while the small-capacity local bit lines are used as single-port line in pipeline fashion (in serial operation).

<Embodiment 5>

According to the fourth embodiment, two global bit lines were used for the read and write operations, respectively, thereby to execute the read and write operations continuously in a single cycle. In contrast, the use of two global bit lines at the time of reading can realize a two-port memory capable of reading the data of two different addresses in a cycle. In other words, data can be read in a cycle smaller by one half than in the conventional method. This operation will be explained as an example operation of the fifth embodiment below.

Figure 14:
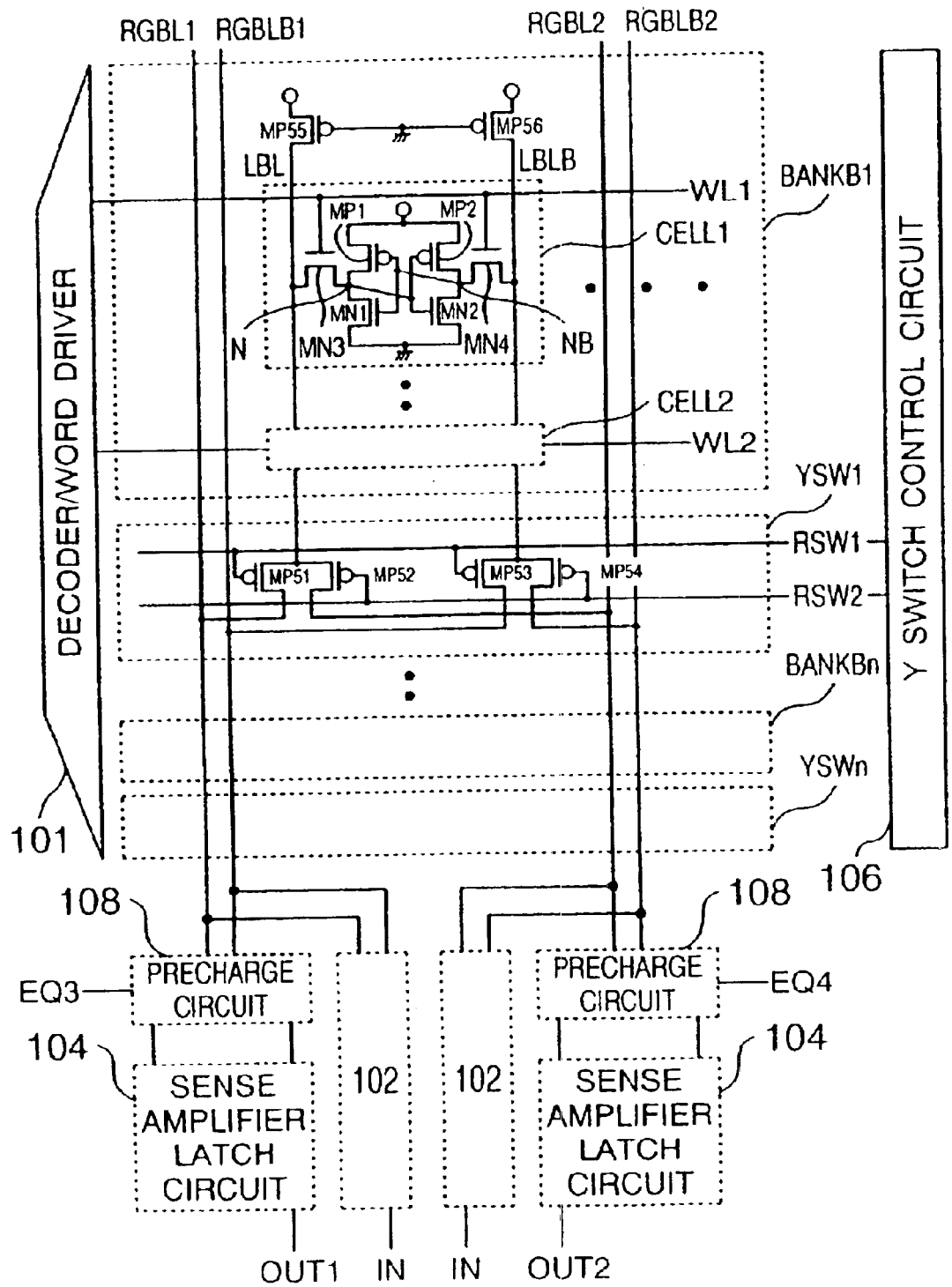
FIG. 14 is a circuit diagram of a semiconductor memory apparatus according to a fifth embodiment.

FIG. 14 is a circuit diagram showing a semiconductor memory apparatus according to another embodiment of the present invention. A semiconductor memory apparatus 500 is different from the semiconductor memory apparatus 100 of the first embodiment in that load transistors MP55, MP56 are connected to the local bit lines (LBL, LBLB) in the banks (BANKB1 to BANKBn), the Y switches (YSW1 to YSWn) are configured of P-channel MOS transistors alone and the two pairs of global bit lines (RGBL1, RGBLB1; RGBL2, RGBLB2) are connected to a read circuit (sense amplifier latch circuit 104) and a write circuit (write amplifier circuit 102), respectively. The other component parts of the semiconductor memory apparatus 500 are identical to the corresponding parts of the semiconductor memory apparatus 100. Like in the semiconductor memory apparatus 100 according to the first embodiment, the sense amplifier latch circuit 104 can be replaced with the sense amplifier latch circuit 105 shown in FIG. 2.

The memory cells CELL1, CELL2 are connected to the word lines WL1, WL2, respectively. The local bit lines (LBL, LBLB) constituting the internal bit lines of the banks are connected to the global bit lines (RGBL1, RGBLB1, RGBL2, RGBLB2) formed in parallel with the local bit lines (LBL, LBLB) across the banks through the Y switches (YSW1 to YSWn) formed adjacently to the banks. The local bit lines (LBL, LBLB) are connected to the load P-channel MOS transistors MP55, MP56. The gates of the P-channel MOS transistors MP55, MP56 are connected to the ground potential. The global bit lines are divided into first global bit lines (RGBL1, RGBLB1) and second global bit lines (RGBL2, RGBLB2). The first global bit lines (RGBL2, RGBLB1) are connected to the local bit lines (LBL, LBLB) through the P-channel MOS transistors MP51, MP53 of the Y switches (YSW1 to YSWn) on the one hand and to the sense amplifier latch circuit 104 on the other hand. The second global bit lines (RGBL2, RGBLB2) are connected to the local bit lines (LBL, LBLB) through the P-channel MOS transistors MP52, MP54 of the Y switches (YSW1 to YSWn) on the one hand and to the sense amplifier latch circuit 104 on the other hand. The gates of the P-channel MOS transistors P51, P53 are connected with a signal line RSW1, and the gates of the P-channel MOS transistors MP52, MP54 are connected with a signal line RSW2.

The decoder/word driver 101 is a circuit for selecting a word line of a given bank. The Y switch control circuit 106 is for controlling the Y switches (YSW1 to YSWn). The first global bit lines (RGBL1, RGBLB1) and the second global bit lines (RGBL2, RGBLB2) are connected to the precharge circuit 108, respectively. The signal lines EQ3, EQ4 are for controlling the precharge circuit 108, respectively. The data read out of the first global bit lines (RGBL1, RGBLB1) are output from the signal line OUT1, and the data read out of the second global bit lines (RGBL2, RGBLB2) are output from the signal line OUT2. The first global bit lines (RGBL1, RGBLB1) and the second global bit lines (RGBL2, RGBLB2) are connected to the write amplifier circuit 102, respectively.

Now, the operation of the circuit according to the present embodiment will be explained with reference to the case in which data are read first from the memory cell CELL1 and then continuously from the memory cell CELL2.

Before starting the operation, the global bit lines (RGBL1, RGBL1, RGBL2, RGBLB2) are precharged to "H" by the precharge circuit 108 after turning the signal lines EQ3, EQ4 to "L".

Then, the signal line EQ3 is set to "H" thereby to suspend the precharge operation of the first global bit lines (RGBL1, RGBLB1). At the same time, the word line WL1 is set to "H", and the local bit lines (LBL, LBLB) are discharged by the memory cell CELL1 thereby to generate a potential difference. Upon the rise of the word line WL1, the control signal RSW1 of the Y switches (YSW1 to YSWn) is turned from "H" to "L", so that the local bit lines (LBL, LBLB) are connected with the first global bit lines (RGBL1, RGBLB1). The potential difference of the local bit lines (LBL, LBLB) generated by the memory cell CELL1 is thus transmitted to the first global bit lines (RGBL1, RGBL1). This potential difference is transmitted further to the sense amplifier latch circuit 104 and data are output to the signal line OUT1 by being amplified at the sense amplifier.

At the time point that the potential difference is transmitted to the sense amplifier, the word line WL1 is turned from "H" to "L" thereby to suspend the data read operation from the memory cell CELL1. At the same time, the control signal RSW1 of the Y switches (YSW1 to YSWn) is turned from "L" to "H". The P-channel MOS transistors of the Y switches (YSW1 to YSWn) are turned off, so that the local bit lines (LBL, LBLB) are separated from the first global bit lines (RGBL1, RGBLB1). At the same time, the signal line EQ3 is turned from "H" to "L", and the first global bit lines (RGBL1, RGBLB1) are precharged to "H" by the precharge circuit 108. Immediately after that, the signal line EQ2 is turned to "H", and the precharge operation of the second global bit lines (RGBL2, RGBLB2) is suspended. At the same time, the word line WL2 is turned to "H", and the local bit lines (LBL, LBLB) are discharged by the memory cell CELL2 thereby to generate a potential difference. As soon as the word line WL2 rises, the control signal RSW2 of the Y switches (YSW1 to YSWn) is turned from "H" to "L". Then the local bit lines (LBL, LBLB) are connected to the second global bit lines (RGBL2, RGBLB2). The potential difference of the local bit lines (LBL, LBLB) generated by the memory cell CELL2 is transmitted to the second global bit lines (RGBL2, RGBLB2). Furthermore, this potential difference is transmitted to the sense amplifier latch circuit 104 and amplified by the sense amplifier thereby to produce data on the signal line OUT2.

At the time point when the potential difference is transmitted to the sense amplifier, the word line WL2 is turned from "H" to "L" and the data read operation from the memory cell CELL2 is suspended. At the same time, the control signal RSW2 of the Y switches (YSW1 to YSWn) is turned from "L" to "H", and the P-channel MOS transistor of the Y switches (YSW1 to YSWn) is turned off thereby to separate the local bit lines (LBL, LBLB) and the second global bit lines (RGBL2, RGBLB2) from each other. Also, the signal line EQ3 is turned from "H" to "L", and the first global bit lines (RGBL1, RGBLB1) are precharged to "H" by the precharge circuit 108. As a result of the above-mentioned operation, data at two different addresses can be read in a single cycle.

Figure 15:
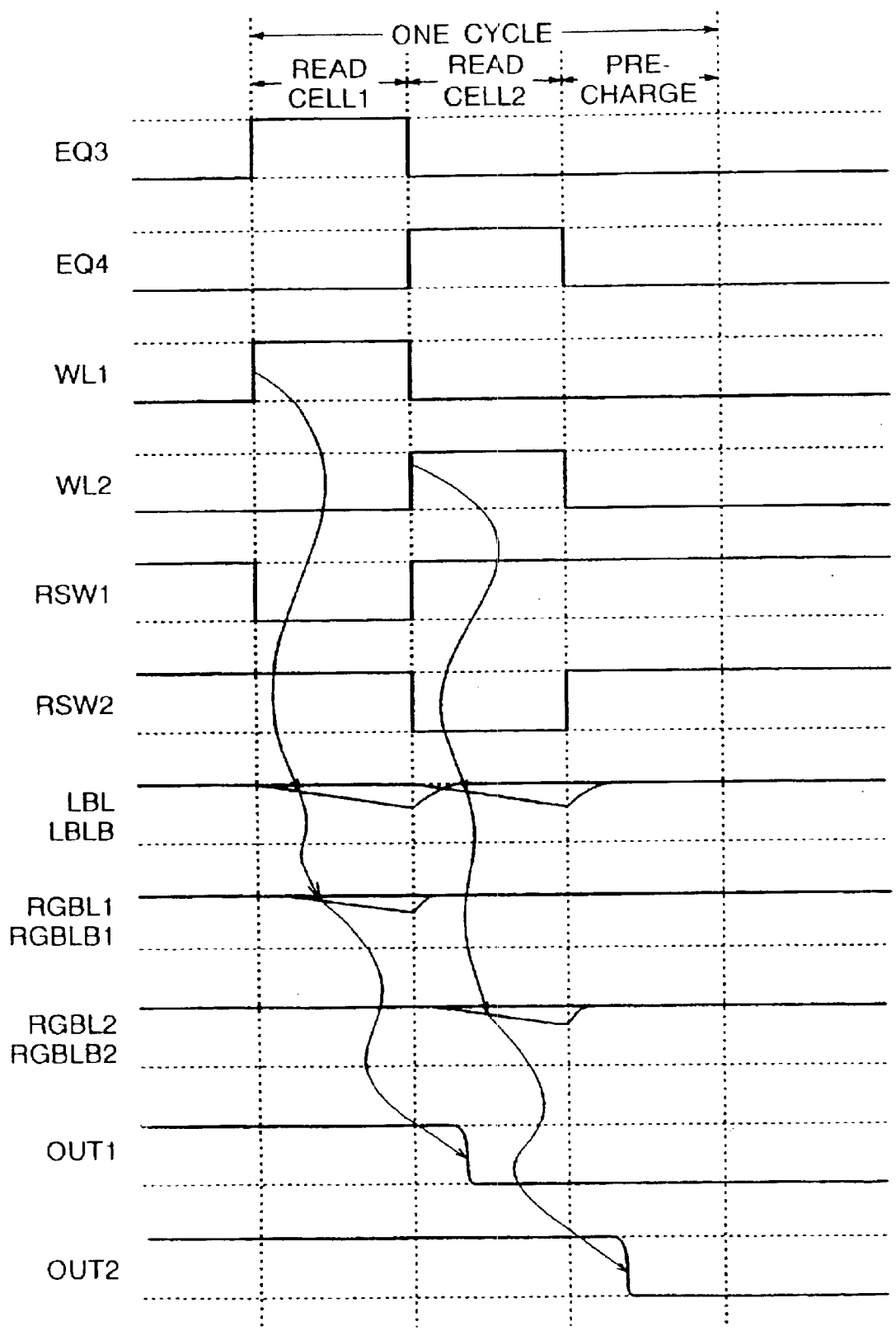
FIG. 15 is a diagram showing an operation waveform of a semiconductor memory apparatus according to the fifth embodiment.

Although the illustration of FIG. 15 indicates that the precharge operation is performed at the end of a cycle in FIG. 15, the precharge can alternatively be effected before the read operation. In other words, the precharge operation can be accomplished in the beginning of the cycle with equal effect.

According to this embodiment, the read and precharge operation can be performed in a cycle for the large-capacity global bit lines, while two read operations can be carried out in a cycle for the small-capacity local bit lines. In other words, each read operation for the local bit lines is accomplished in one half of a cycle without any precharge operation. The local bit lines need not be precharged by reason of the fact that the large-capacity global bit lines are already precharged and the local bit lines are connected with a load P-channel MOS transistors kept turned on, and therefore the local bit lines are kept at a potential in the neighborhood of the source voltage. In this way, the use of a bank in the same manner as if it is a two-port memory cell makes it possible to execute the high-speed read operation continuously.

<Embodiment 6>

Figure 16:
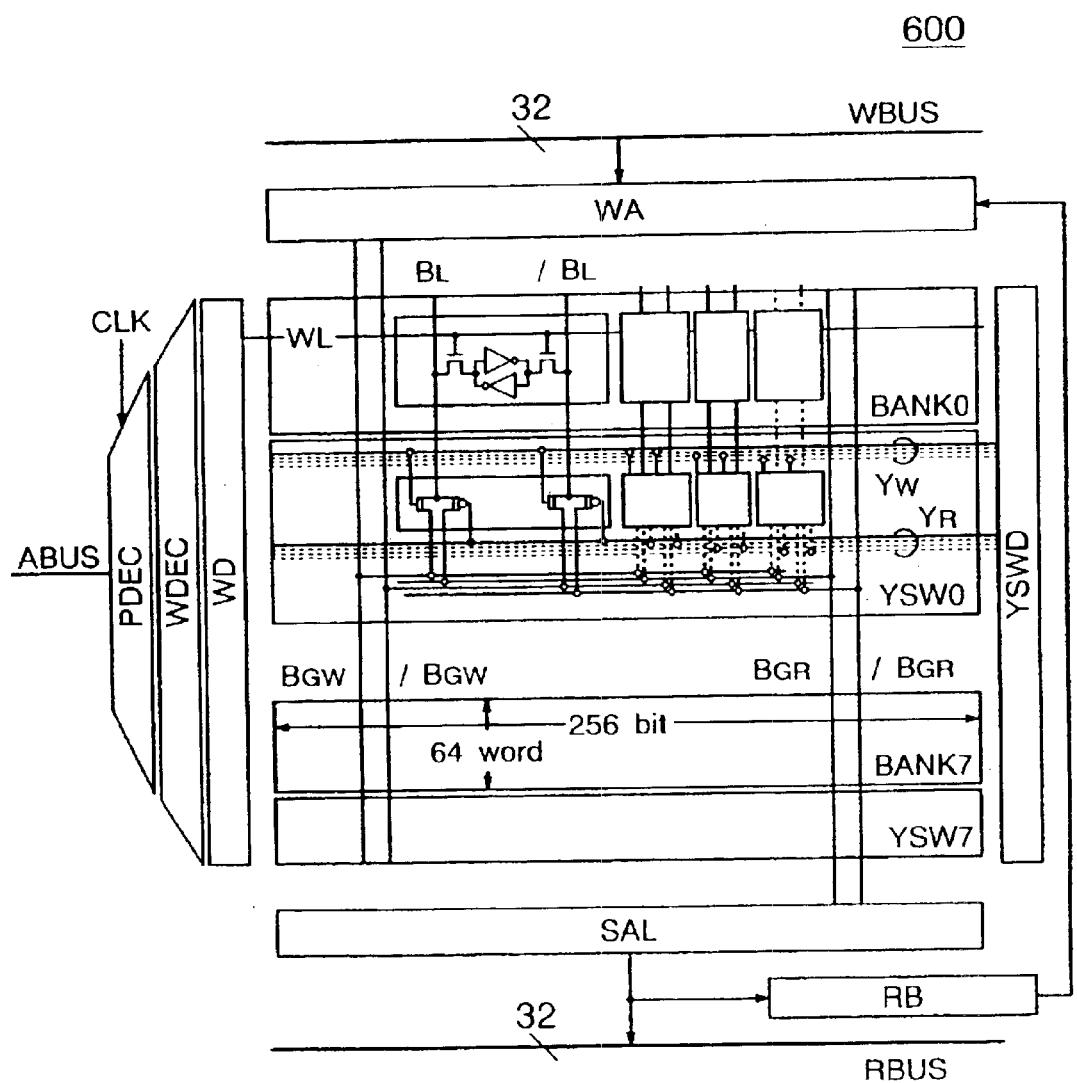
FIG. 16 is a circuit diagram showing a semiconductor memory apparatus according to a sixth embodiment.

FIG. 16 shows a semiconductor memory apparatus 600 comprising the same cache data array 112 and the same recovery buffer 114 as in the second embodiment. The semiconductor memory apparatus 600 includes eight memory banks (BANK0 to BANK7), eight Y switch circuits (YSW0 to YSW7), a Y switch decode circuit YSWD, a word driver WD, a word decoder WDEC, a predecoder PDEC, a sense amplifier latch circuit SAL, a write amplifier WA and a recovery buffer RB. The memory banks (BANK0 to BANK7) and the Y switch circuits (YSW0 to YSW7) of the semiconductor memory apparatus 600 have the same circuit configuration and layout as the memory banks (BANKn) and the Y switch circuits (YSWn), respectively, of the semiconductor memory apparatus 100 in the first embodiment.

The memory cell array is divided into eight banks (BANK0 to BANK7), each having a column of 64 word lines by 256 bits. The memory cell array is configured of a plurality of six-transistor single-port SRAM cells. The local bit line pair (BL, /BL) in each bank is connected to the write global bit line pair (BGW, /BGW) through the Y switches YSW of the N-channel MOS transistors. The local bit line pair (BL, /BL) is connected to the read global bit line pair (BGR, /BGR) through the Y switches YSW of the P-channel MOS transistors.

One of the select signals YR is turned to "L" and the P-channel MOS transistor is turned on in such a manner that the signal of a selected memory cell is transmitted to the read global bit line pair (BGR, /BGR). The signal thus transmitted to the read global bit line pair (BGR, /BRG) is detected and amplified at the sense amplifier latch circuit SAL, and output to a read bus RBUS. The read bus has a width of 32 bits. The sense amplifier latch circuit SAL is makes up a differential sense amplifier (sense amplifier latch circuit 105) as shown in FIG. 2.

One of the select signals YW is set to "H" and the N-channel MOS transistor is turned on so that the data input through the write amplifier WA from the write bus WBUS is transmitted to the write global bit line pair (BGW, /BGW) during the write operation. The write bus WBUS also has a width of 32 bits.

An address is input to the predecoder PDEC and decoded therein in synchronism with a clock CLK from the address bus ABUS. Further, the output of the predecoder PDEC is applied to the word decoder WDEC and decoded therein appropriately. The output of the word decoder WDEC is applied to the word driver WD thereby to select the word line WL.

Figure 17:
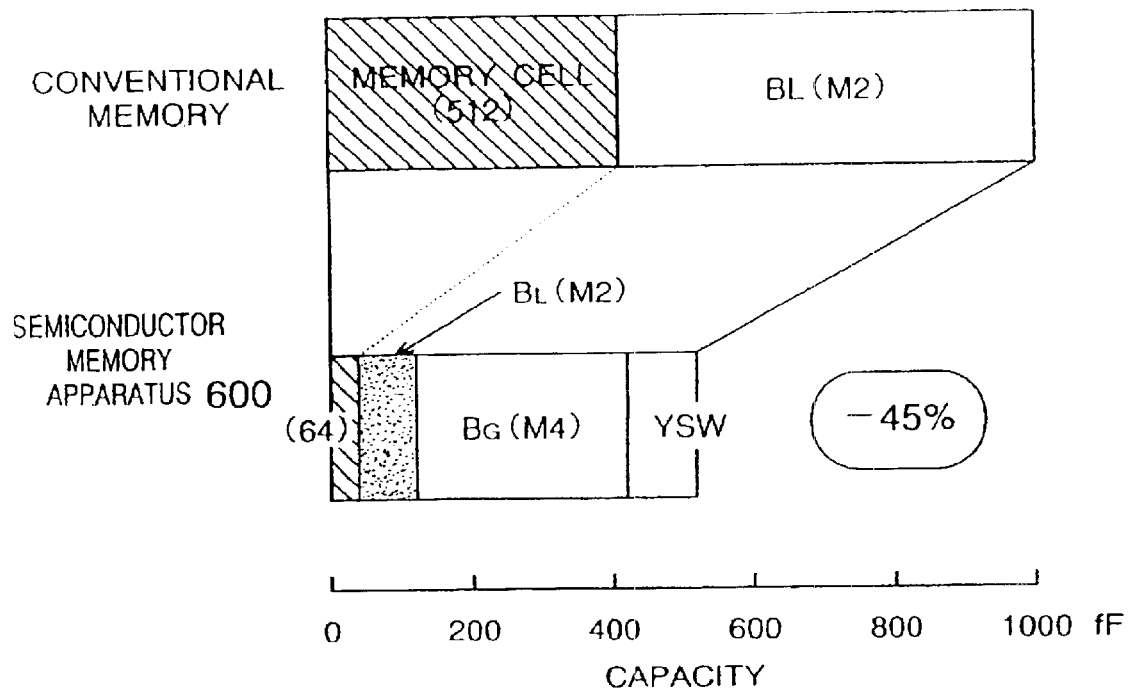
FIG. 17 shows a bit line capacity of a semiconductor memory apparatus according to the sixth embodiment.

FIG. 17 shows the bit line capacity of a semiconductor memory apparatus 600. The bit line capacity of the semiconductor memory apparatus 600 can be reduced by about 45% compared with the conventional memory having the same storage capacity (hereinafter referred to simply as the conventional memory in the sixth embodiment) using no global bit lines. The capacity of the memory cells connected to the bit lines (local bit lines) is designated as "Memory Cell". The figures in parentheses indicate the number of memory cells. Since the semiconductor memory apparatus 600 is divided into eight banks, the number of memory cells is reduced by a factor of ⅛ as compared with the memory of the prior art. The capacity of the bit lines (local bit lines) is expressed as "BL". The character M2 in the parenthesis indicates the second-layer metal. Specifically, it indicates that the bit lines use the second-layer metal. The capacity of the global bit lines is expressed as BG. The character M4 in the parenthesis indicates the fourth-layer metal. Specifically, it indicates that the global bit lines use the fourth-layer metal. The capacity of the Y switch circuit connecting the local bit lines and the global bit lines is designated as YSW. The global bit lines use the fourth-layer metal (uppermost layer), and therefore the capacity per unit length of the global bit lines (0.11 fF/$\mu$m) is smaller than the counterpart of the local bit lines (0.19 fF/$\mu$m). As a result, the global bit lines of the semiconductor memory apparatus 600 are substantially as long as the bit lines of the conventional memory. In spite of this, the capacity of the global bit lines of the semiconductor memory apparatus 600 is smaller that of the bit lines of the conventional memory.

Figure 18:
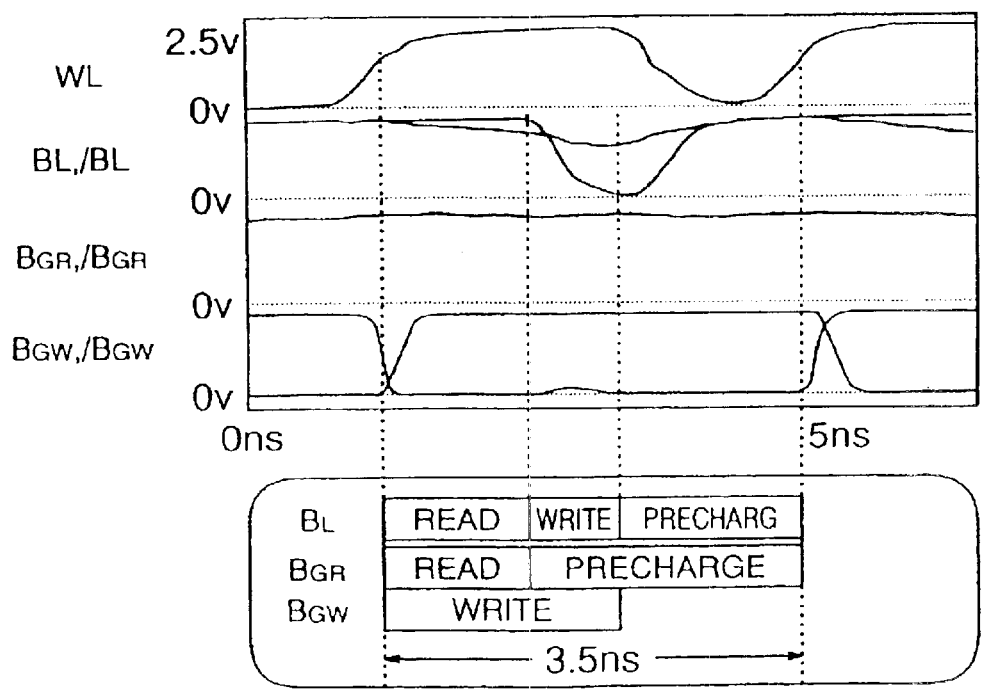
FIG. 18 is a diagram showing a simulation operation waveform of a semiconductor memory apparatus according to the sixth embodiment.

FIG. 18 shows a simulation waveform of the semiconductor memory apparatus 600. This simulation result is obtained with an operation source voltage of 2.5 V at an operation ambience temperature of 75° C. The write amplifier WA can drive the write global bit line pair (BGW, /BGW) during the period when the signal read from the memory cells is transmitted to the read global bit line pair (BGR, /BGR). After the read operation, the N-channel MOS transistor of the Y switch YSW is turned on. In this way, the write data can be transmitted to the local bit line pair (BL, /BL) without precharge during the period between read and write operations for the local bit line pair (BL, /BL). Also, the read global bit line pair (BGR, /BGR) can be precharged during the period when the write data are written into the memory cells. It is entirely unnecessary to precharge the write global bit line pair (BGW, /BGW). Specifically, the read, write and precharge operations are executed in that order for the local bit line pair (BL, /BL). For the read global bit line pair (BGR, /BGR), on the other hand, the read and precharge operations are performed in that order. Only the write operation is performed for the write global bit line pair (BGW, /BGW). Consequently, the read operation for the read global bit line pair (BGR, /BGR) is executed concurrently with the write operation for the write global bit line pair (BGW, /BGW).

The simulation result in FIG. 18 shows that the two operations of write and read for the semiconductor memory apparatus 600 can be realized in 3.5 ns. In other words, the semiconductor memory apparatus 600 executes the read and write operations in a cycle of 285 MHz in operating frequency.

Figure 19:
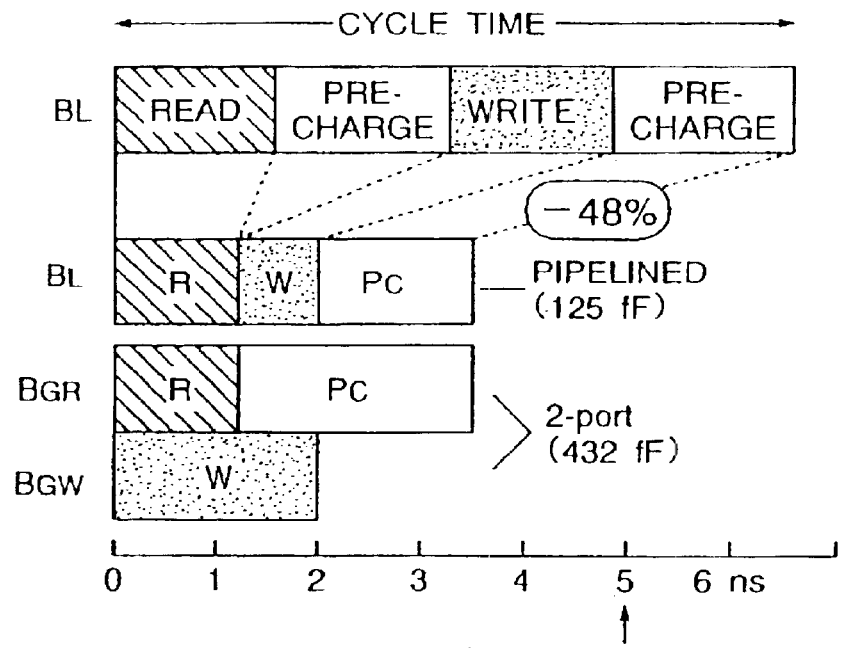
FIG. 19 is a diagram comparing the cycle time of a semiconductor memory apparatus according to the sixth embodiment with that of the prior art.

FIG. 19 shows a comparison of cycle time between the semiconductor memory apparatus 600 and the conventional memory apparatus. The cycle time of the semiconductor memory apparatus 600 is 48% shorter than that of the conventional memory. The conventional memory comprises neither a read global bit line pair nor a write global bit line pair. As a result, for both the read and write operations to be performed, a cycle time twice as long is required. In the semiconductor memory apparatus 600, the local bit lines (BL, /BL) small in capacity are used in pipeline fashion (expressed as "pipelined" in FIG. 19), and the two global bit line pairs (BGR, /BGR; BGW, /BGW) large in capacity are used as two ports (expressed as "2-port" in FIG. 19). The numerals in parentheses in FIG. 19 denote the load capacity of the bit lines.

The read operation is designated as "Read" or "R", the write operation as "Write" or "W" and the precharge operation as "Precharge" or "Pc". Also, a bit line or a local bit line is abbreviated as "BL", a read global bit line as "BGR", and a write global bit line as "BGW".

Figure 20A:
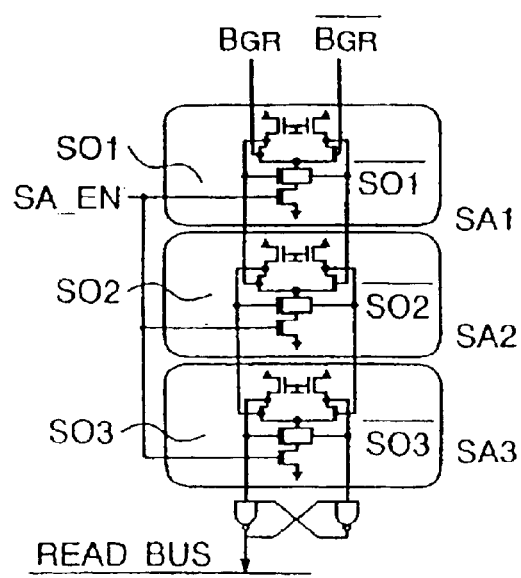
FIG. 20 shows a circuit configuration and a simulation waveform of a sense amplifier latch circuit of a semiconductor memory apparatus according to the sixth embodiment.
Figure 20B:
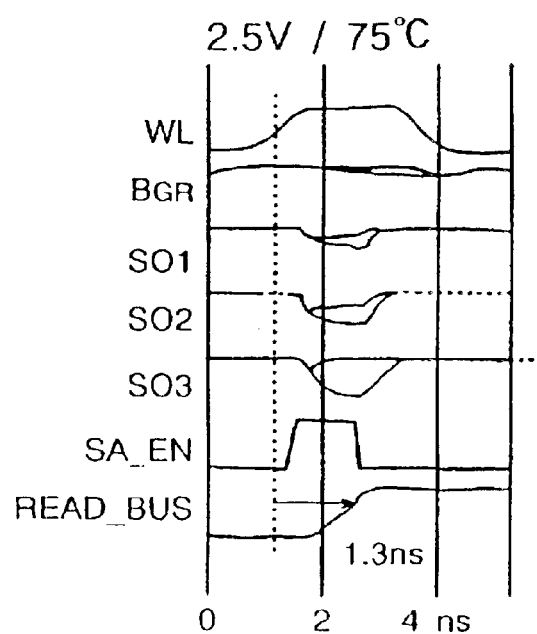

FIG. 20 shows a circuit configuration of the sense amplifier latch circuit SAL and a simulation waveform thereof. The simulation is the result obtained under the condition of an operation source voltage of 2.5 V and an operating ambient temperature of 75° C. The time after the rise of the word line WL to the time of reading the data out on the read bus RB US (Read Bus) is 1.3 ns. The read global bit line is expressed as BRG, the output line of the first-stage sense amplifier SA1 as SO1, the output line of the second-stage sense amplifier SA2 as SO2, and the output line of the third-stage sense amplifier SA3 as SO3. The sense amplifier enable signal SA_EN is enabled to "H" level before a potential difference is generated in the read global bit lines (BRG, /BGR). In other words, it indicates a timing-free sense amplifier.

Figure 21:
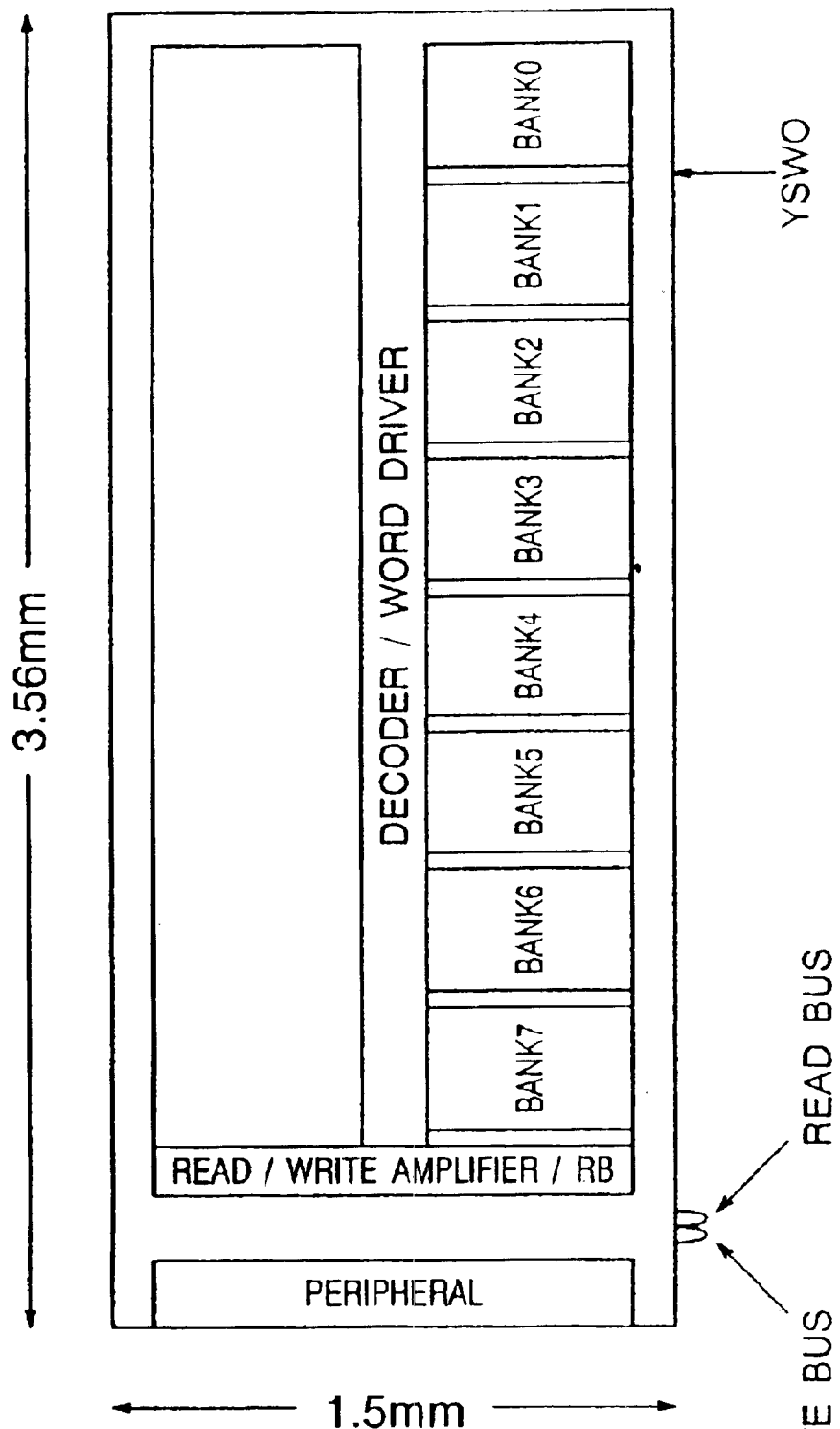
FIG. 21 is a photographic copy of a prototype of a semiconductor memory apparatus according to the sixth embodiment.

FIG. 21 shows a photographic copy of a prototype of the semiconductor memory apparatus 600. A word decoder WDEC, a word driver WD and a Y switch decoder circuit YSW are arranged in an area designated as "Decoder/Word Driver". The sense amplifier latch circuit SAL, the write amplifier WA and the recovery buffer RB are arranged in an area designated as "Read/Write amplifier /RB", and the wiring of a read bus RB US in an area designated as "Read Bus". The wiring of the write bus W BUS is arranged in an area designated as "Write Bus". The predecoder and other necessary circuits are arranged in an area designated as "Peripheral".

The semiconductor memory apparatus 600 is fabricated with the 0.35-μm four-layer metal wiring CMOS technique. The gate length of the N-channel MOS transistor and the P-channel MOS transistor is 0.4 μm. The pitches of the metal wiring are 1.4 μm. The size of the semiconductor memory apparatus 600 is 1.5 mm×3.56 mm.

Figure 22:
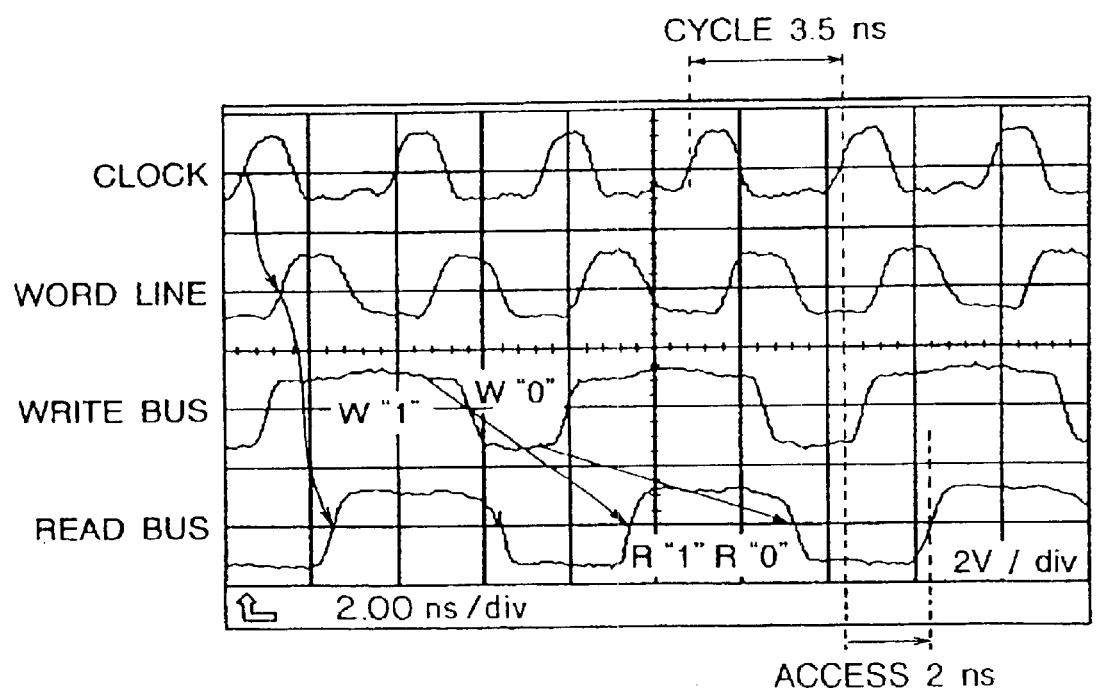
FIG. 22 is a diagram showing an operation waveform of a semiconductor memory apparatus according to the sixth embodiment.

FIG. 22 shows actual measurement of operation waveforms of the semiconductor memory apparatus 600. This diagram shows waveforms of a 285-MHz clock, a word line WL (Word Line), a write bus WBUS (Write Bus) and a read bus RBUS (Read Bus). The abscissa represents the time, and the ordinate the output voltage. Each cycle is 3.5 ns, and the access time is 2 ns. Thus, the read and write operations are executed in one cycle of 285 MHz in operation frequency. The features of the semiconductor memory apparatus 600 are as follows:

(1) Storage capacity: 4 K×32 bits (16 Kbytes)
(2) Read port: one
(3) Write port: one
(4) Source voltage: 2.5 V
(5) Cycle time: 3.5 ns
(6) Clock access time: 2.0 ns
(7) Power consumption: 130 mW (for the operating clock frequency of 200 MHz)
(8) Memory cell size: 4.2×5.16 μm (6 transistors)
(9) Chip size: 1.5×3.56 mm
(10) Process: four-layer metal wiring 0.35-μm CMOS
(11) Metal wiring pitch: 1.4 μm
(12) Band width: 2.3 Gbytes/s The invention developed by the present inventors has been explained specifically above with reference to embodiments. The present invention, however, is not limited to these embodiments, but of course can be modified in various ways without departing from the spirit thereof. The memory cell of the semiconductor memory apparatus shown in FIG. 1, which is of what is called the static type, for example, can be replaced by a similar memory cell of what is called the dynamic type including one MOS transistor and one capacitor. Also, the cache memory shown in FIG. 8 which is of the direct map type can be replaced with a similar cache memory of set associative type or full associative type. Each line of the cache data array 112, which represents 256 bits, can alternatively represent a multiple of the input/output data width such as 128 bits or 512 bits. Furthermore, the input/output data width of 32 bits or 64 bits of the cache data array 112 may alternatively be 128 bits. The microprocessor 130 shown in FIG. 10 may have a secondary cache built therein. What is more, the cache memory shown in FIG. 2 can be used as the secondary cache. In addition, the computer system of FIG. 10 may be a cacheless memory. In other words, a main memory unit can be used for the function of the secondary cache.

What is claimed is:

1. A semiconductor circuit comprising:

a first memory block having a plurality of first pairs of bit lines, a plurality of first word lines, and a plurality of first SRAM memory cells coupled to said plurality of first pairs of bit lines and first word lines;

a second memory block having a plurality of second pairs of bit lines, a plurality of second word lines, and a plurality of second SRAM memory cells coupled to said plurality of second pairs of bit lines and said second word lines;

a sense amplifier and a write amplifier;

a first pair of wiring lines coupled to said sense amplifier;

a second pair of wiring lines coupled to said write amplifier;

a first switch circuit which electrically connects one pair of said plurality of said first and second pairs of bit lines to said first pair of wiring lines; and a second switch circuit which electrically connects one pair of said plurality of said first and second pairs of bit lines to said second pair of wiring lines, wherein said first pair of wiring lines lies over said first and second memory block, and extends in a first direction of which said plurality of first pairs of bit lines and second pairs of bit lines extend, wherein said second pair of wiring lines lies over said first and second memory block, and extends in said first direction, wherein said first pair and second pairs of wiring lines are formed in a first metal layer, wherein said plurality of first pairs of bit lines and second pairs of bit lines are formed in a second metal layer, wherein read operations of said first and second SRAM memory cells are performed by using said first pair of wiring lines, and wherein write operations of said first and second SRAM memory cells are performed by using said second pair of wiring lines.

2. The semiconductor circuit according to claim 1, wherein a voltage between one pair of said plurality of first and second pairs of bit lines which is selected for a read operation is amplified by said sense amplifier.

3. The semiconductor circuit according to claim 2, wherein said first and second pairs of wiring lines have an overlap in their operating period.

4. The semiconductor circuit according to claim 3, wherein said overlap is to perform both read and write operations of one of said plurality of first and second SRAM memory cells.

5. The semiconductor circuit according to claim 2, wherein said first switch circuit comprises a plurality of first MOSFETs, each having a source/drain path coupled between said first pair of wiring lines and each of said plurality of first pairs of bit lines, and a plurality of second MOSFETs, each having a source/drain path coupled between said first pair of wiring lines and each of said plurality of second pairs of bit lines, wherein said second switch circuit comprises a plurality of third MOSFETs, each having a source/drain path coupled between said second of wiring lines and each of said plurality of first pairs of bit lines, and a plurality of fourth MOSFETs, each having a source/drain path coupled between said second pair of wiring lines and each of said plurality of second pairs of bit lines.

6. The semiconductor circuit according to claim 5, further comprising:

a switch control circuit which outputs signals to control gates of said plurality of said first, second, third and fourth MOSFETs; and a precharge circuit coupled to said first pair of wiring lines.

7. The semiconductor circuit according to claim 5, further comprising:

a switch control circuit which outputs signals to control gates of said plurality of said first, second, third and fourth MOSFETs;

a decoder circuit coupled to said plurality of said first and second word lines; and a precharge circuit coupled to said first pair of wiring lines, wherein said first and second memory blocks are placed between said decoder circuit and said switch control circuit.

8. The semiconductor circuit according to claim 7, further comprising:

a third memory block having a plurality of third pairs of bit lines, a plurality of third word lines, and a plurality of third SRAM memory cells coupled to said plurality of third pairs of bit lines and third word lines, wherein said plurality of first and third MOSFETs are placed between said first and second memory blocks, and wherein said plurality of second and fourth MOSFETs are placed between said second and third memory blocks.

* * * * *